US012660174B2

(12) United States Patent
Ahn et al.

(10) Patent No.: US 12,660,174 B2
(45) Date of Patent: Jun. 16, 2026

(54) SEMICONDUCTOR DEVICE

(71) Applicant: Samsung Electronics Co., Ltd.,
Suwon-si (KR)

(72) Inventors: Junhyeok Ahn, Suwon-si (KR); Euna Kim, Suwon-si (KR); Myeongdong Lee, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 280 days.

(21) Appl. No.: 18/341,394

(22) Filed: Jun. 26, 2023

(65) Prior Publication Data

US 2024/0155833 A1    May 9, 2024

(30) Foreign Application Priority Data

Nov. 9, 2022    (KR) ........................ 10-2022-0148810

(51) Int. Cl.
H10B 12/00 (2023.01)
G11C 11/4097 (2006.01)

(52) U.S. Cl.
CPC ......... H10B 12/482 (2023.02); H10B 12/315 (2023.02); H10B 12/488 (2023.02)

(58) Field of Classification Search
CPC .. H10B 12/482; H10B 12/315; H10B 12/488; H10B 12/34; H10B 12/0335; H10B 12/02; H10B 12/09; G11C 11/4097
See application file for complete search history.

(56) References Cited

U.S. PATENT DOCUMENTS

| | | | |
|---|---|---|---|
| 8,513,114 B2 | 8/2013 | Tagami | |
| 9,419,000 B2 | 8/2016 | Kim et al. | |
| 10,840,440 B2 | 11/2020 | Yang et al. | |
| 11,011,526 B2 | 5/2021 | Park et al. | |
| 11,270,885 B2 | 3/2022 | Lee et al. | |
| 2018/0226410 A1* | 8/2018 | Chang | H10B 12/485 |
| 2020/0194302 A1* | 6/2020 | Ahn | H10B 12/488 |

(Continued)

FOREIGN PATENT DOCUMENTS

| | | |
|---|---|---|
| KR | 20180005466 A | 1/2018 |
| KR | 20200072313 A | 6/2020 |

OTHER PUBLICATIONS

Korean Office Action for corresponding Korean Application No. 10-2022-0148810 dated Apr. 8, 2026.

*Primary Examiner* — Sonya McCall-Shepard
(74) *Attorney, Agent, or Firm* — Harness, Dickey & Pierce, P.L.C.

(57) ABSTRACT

A semiconductor device includes a substrate having an active region; word line structures in the substrate and extending in parallel to each other in a first horizontal direction; bit line structures on the substrate and the word line structures and extending in parallel to each other in a second horizontal direction that intersects the first horizontal direction; storage node contacts on a side wall of each of the bit line structures and electrically connected to the active region; and a fence structure having first line pattern portions on the word line structures and extending in the first horizontal direction, second line pattern portions extending in the second horizontal direction, and pillar portions extending from the first line pattern portions between the bit line structures in a vertical direction that is perpendicular to an upper surface of the substrate.

20 Claims, 30 Drawing Sheets

(56) References Cited

U.S. PATENT DOCUMENTS

| | | | |
|---|---|---|---|
| 2021/0066200 A1* | 3/2021 | Park | H10B 12/34 |
| 2022/0115383 A1 | 4/2022 | Yoon et al. | |
| 2023/0089688 A1 | 3/2023 | Ahn et al. | |

* cited by examiner

SEMICONDUCTOR DEVICE

CROSS-REFERENCE TO RELATED APPLICATION(S)

This application claims benefit of priority to Korean Patent Application No. 10-2022-0148810 filed on Nov. 9, 2022 in the Korean Intellectual Property Office, the disclosure of which is incorporated herein by reference in its entirety.

BACKGROUND

Various example embodiments relate to a semiconductor device.

Electronic devices are being further miniaturized and implemented for high-performance, according to the development of the electronics industry and the needs or expectations of users and/or consumers. Accordingly, semiconductor devices used in electronic devices are also required or expected to be highly integrated and/or to have high performance. In order to manufacture highly scaled semiconductor devices, contact technologies for stably connecting adjacent conductive structures while minimizing or reducing resistance between adjacent conductive structures are required or desired.

SUMMARY

Various example embodiments provide a semiconductor device having improved productivity and/or electrical characteristics.

According to various example embodiments, a semiconductor device includes a substrate having an active region; word line structures in the substrate and extending in parallel to each other in a first horizontal direction; bit line structures on the substrate and on the word line structures and extending in parallel to each other in a second horizontal direction that intersects the first horizontal direction; storage node contacts on a side wall of each of the bit line structures and electrically connected to the active region; and a fence structure having first line pattern portions on the word line structures and extending in the first horizontal direction, second line pattern portions extending in the second horizontal direction, and pillar portions extending in a vertical direction from the first line pattern portions that are between the bit line structures, the vertical direction perpendicular to an upper surface of the substrate.

Alternatively or additionally according to some example embodiments, a semiconductor device includes a substrate having a first region and a second region and including an active region; a peripheral gate structure including a peripheral dielectric layer, a peripheral gate electrode, and a peripheral capping layer that are sequentially stacked on the second region; a peripheral insulating liner conformally covering the peripheral gate structure; a word line structure extending from the first region in a first horizontal direction; a bit line structure on the substrate and on the word line structure, extending in a second horizontal direction that intersects the first horizontal direction, and including a bit line and a bit line capping pattern on the bit line; a spacer structure on first and second or both sides of the bit line structure; a storage node contact on at least one side of the bit line structure and electrically connected to the active region; and a fence structure on the word line structure and including a first line pattern portion extending in the first horizontal direction and pillar portions extending from the first line pattern portion toward the substrate in a vertical direction, wherein the bit line capping pattern includes a first capping pattern having a material, identical to a material of the peripheral capping layer, and the bit line capping pattern includes a second capping pattern having a material, identical to a material of the peripheral insulating liner. The first line pattern portion is on an upper surface of the second capping pattern.

Alternatively or additionally according to some example embodiments, a semiconductor device includes a substrate having an active region; word line structures in the substrate and extending in parallel to each other in a first horizontal direction; a bit line structure on the substrate and the word line structures, extending in a second horizontal direction that intersects the first horizontal direction, and including a bit line and a bit line capping pattern on the bit line; storage node contacts on a side wall of the bit line structure and electrically connected to the active region; and an insulating structure in the bit line capping pattern, and including a line pattern portion extending in the second horizontal direction and protrusions integrally connected to the line pattern portion and protruding in a region vertically overlapping each of the word line structures. Each of the protrusions has a portion overlapping each of the word line structures in a vertical direction, perpendicular to an upper surface of the substrate.

BRIEF DESCRIPTION OF DRAWINGS

The above and other aspects, features, and advantages of various example embodiments will be more clearly understood from the following detailed description, taken in conjunction with the accompanying drawings, in which:

FIG. 2A illustrates a cross-section of FIG. 1A, taken along lines I-I' and II-II', FIG. 2B illustrates a cross-section of FIG. 1A, taken along lines III-III' and IV-IV', and FIG. 2C illustrates a cross-section of FIG. 1B, taken along line V-V'.

FIG. 3 is an enlarged view of the fence structure of FIGS. 1A to 2C.

FIGS. 4A to 4C are enlarged views of portion 'A' of FIG. 2A.

DETAILED DESCRIPTION

Hereinafter, terms such as "upper," "intermediate," "lower," and the like may be replaced with other terms, such as "first," "second," "third," and the like, to be used for describing components of the specification. Terms such as "first," "second," "third," and the like may be used to describe various components, but the components are not limited by the above terms, and "first component" may be named as "the second component."

Hereinafter, with reference to the accompanying drawings, preferred embodiments of various example embodiments will be described as follows.

Figure 1A:
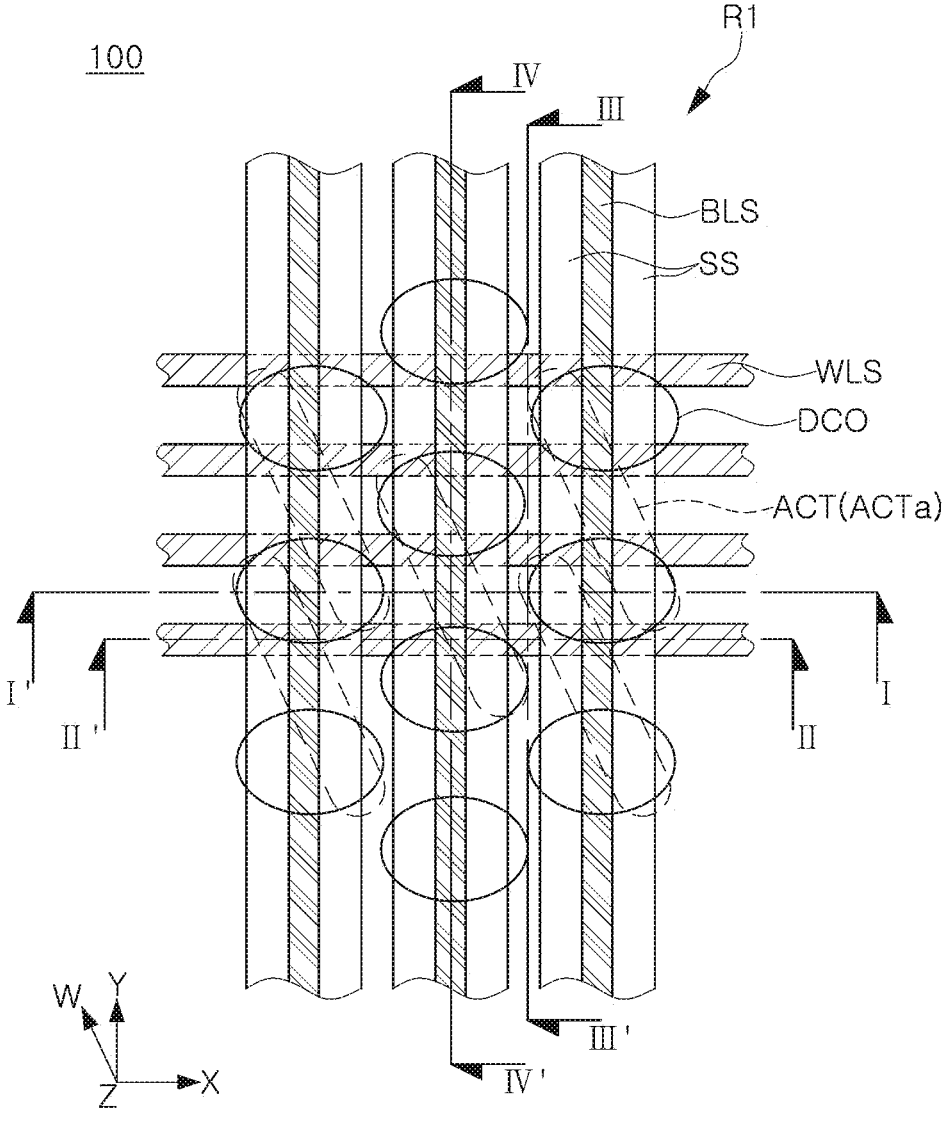
FIGS. 1A and 1B are schematic plan views of a semiconductor device according to various example embodiments.
Figure 1B:
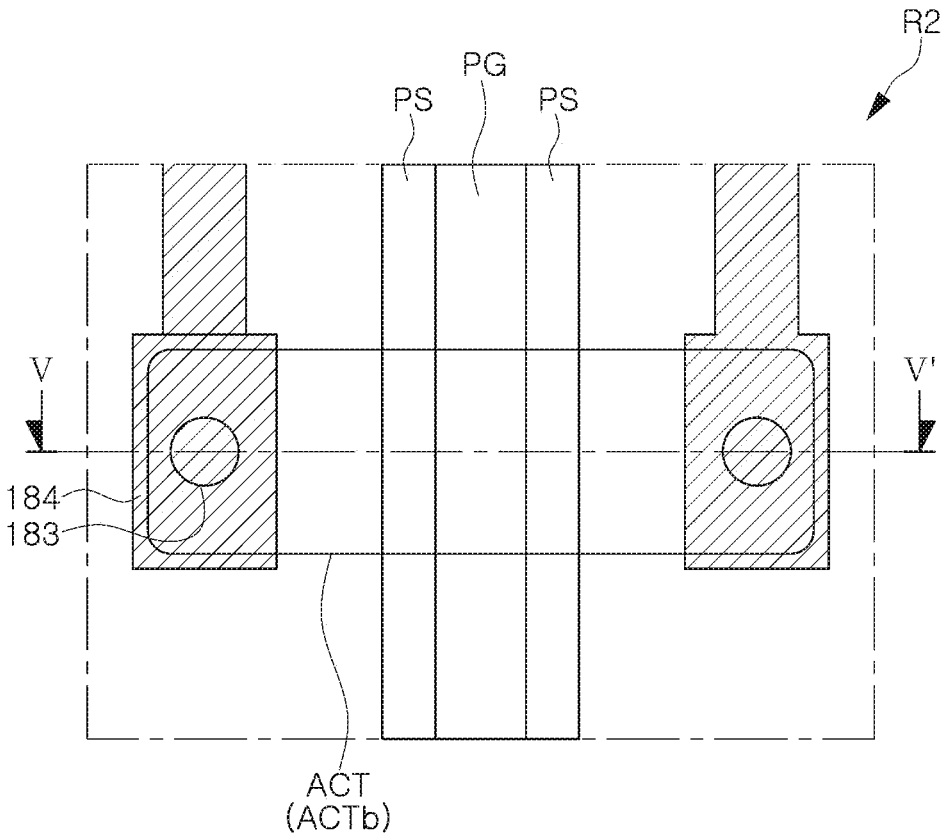

FIGS. 1A and 1B are schematic plan views of a semiconductor device according to various example embodiments.

Figure 2A:
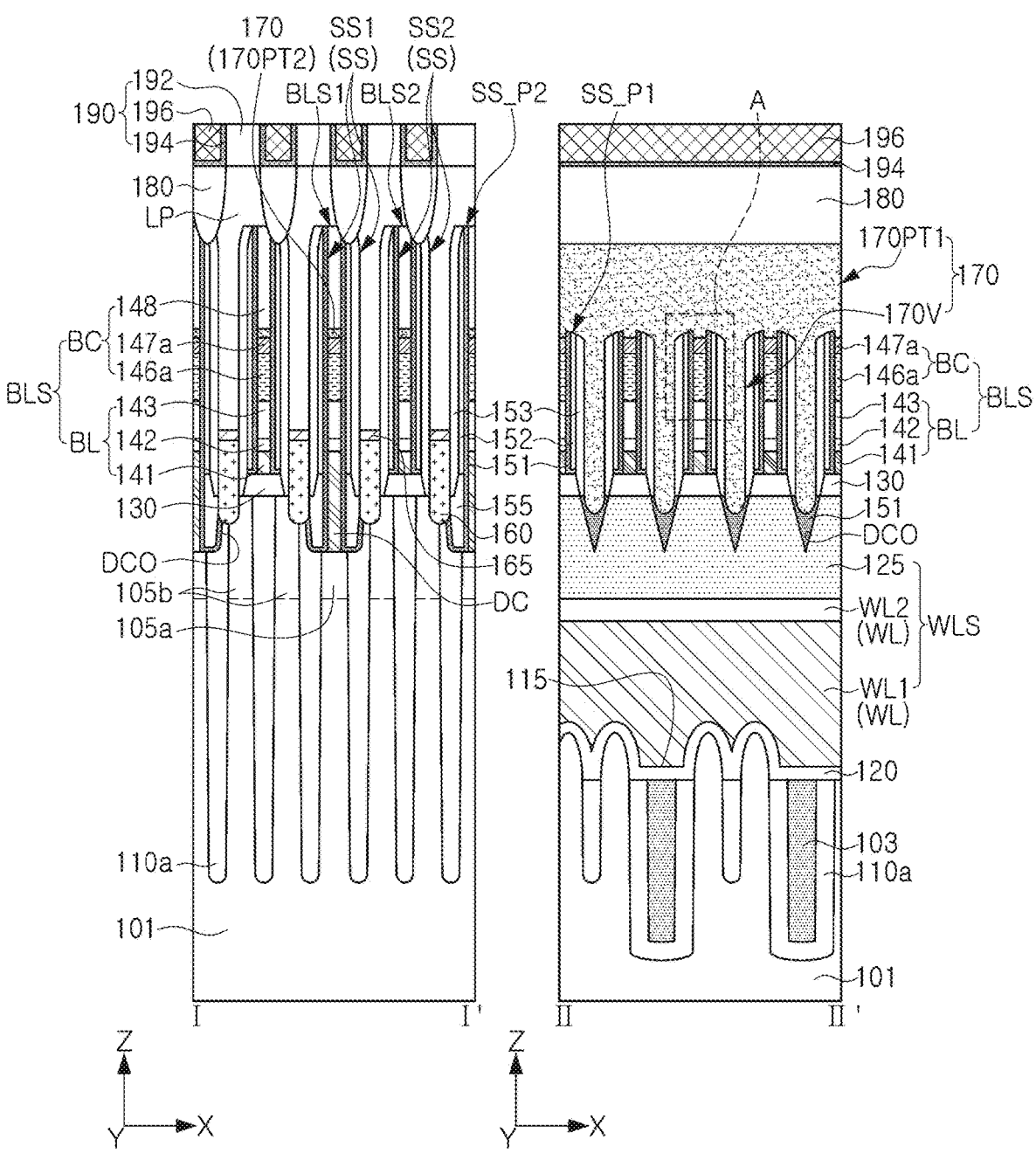
FIGS. 2A, 2B, and 2C are schematic cross-sectional views of a semiconductor device according to various example embodiments.
Figure 2B:
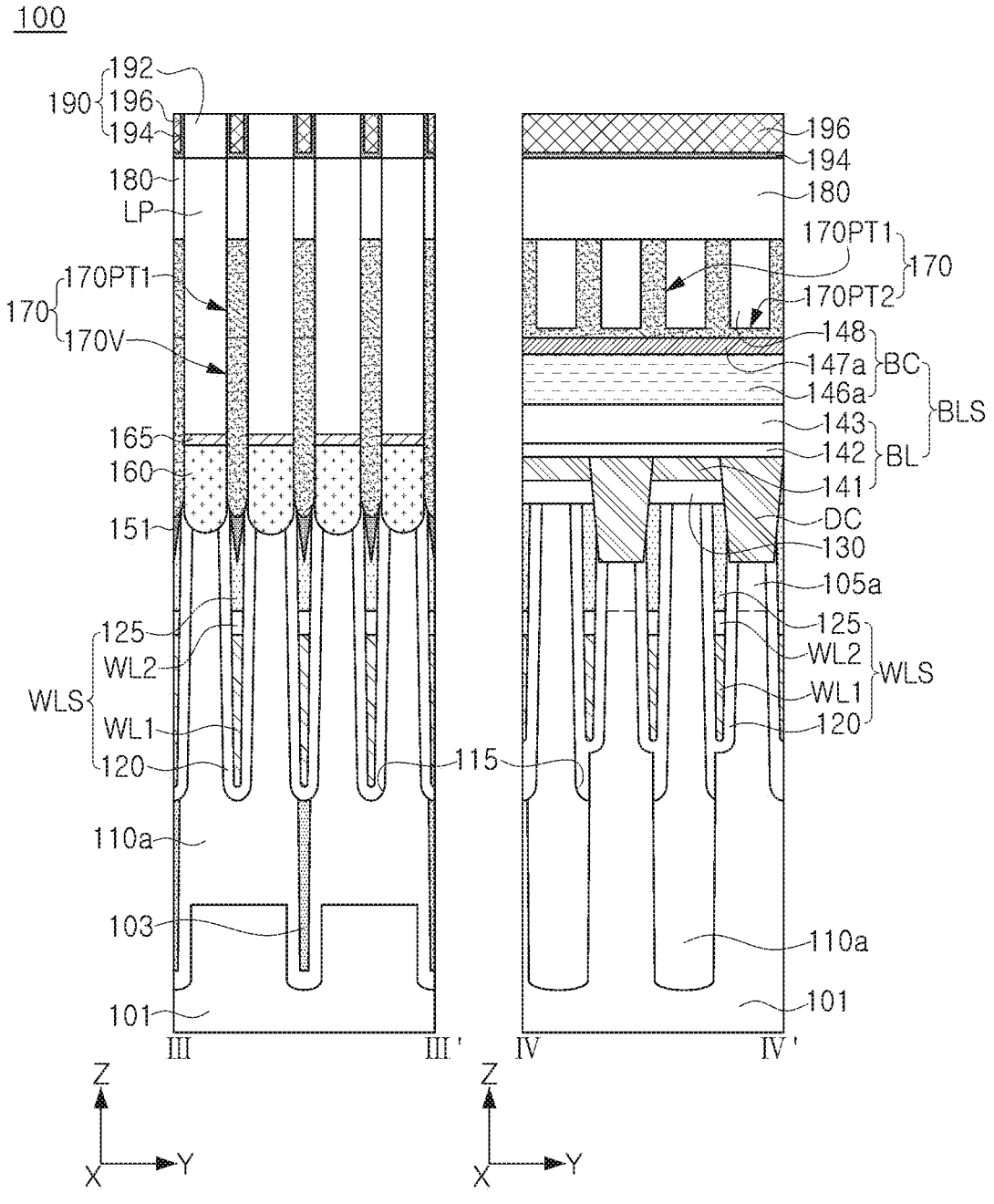
Figure 2C:
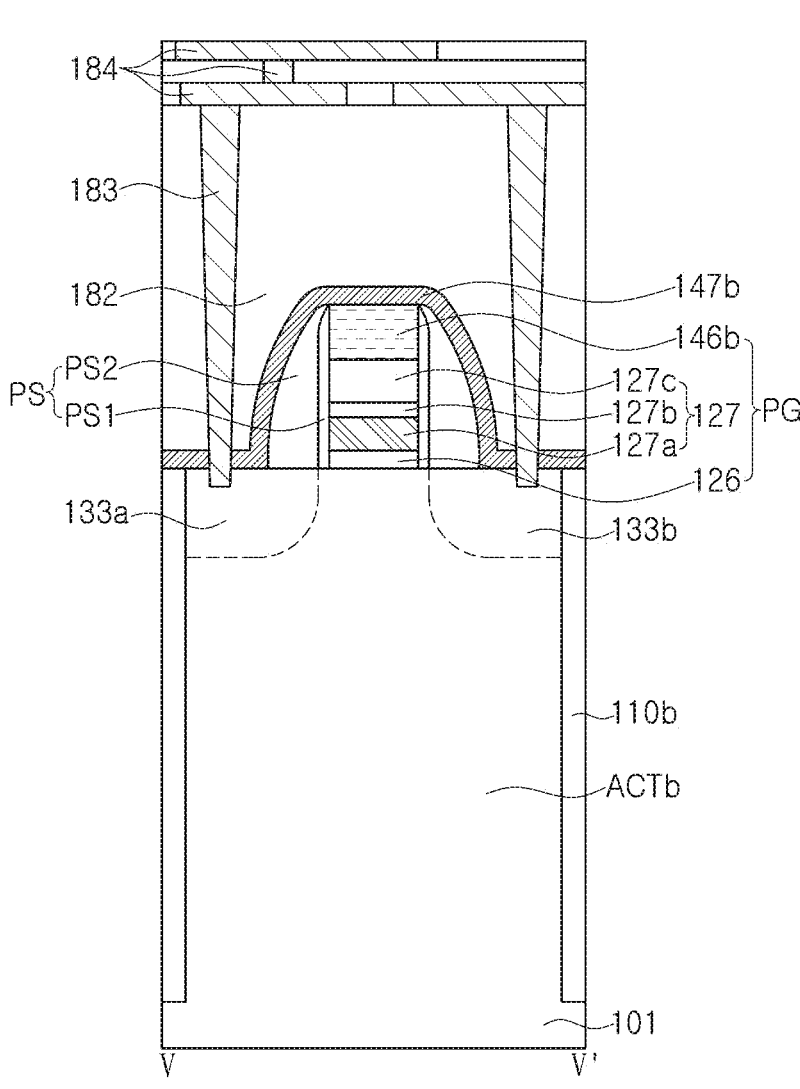

FIGS. 2A, 2B, and 2C are schematic cross-sectional views of a semiconductor device according to various example embodiments. FIG. 2A illustrates a cross-section of FIG. 1A, taken along lines I-I' and II-II', FIG. 2B illustrates a cross-section of FIG. 1A, taken along lines III-III' and IV-IV', and FIG. 2C illustrates a cross-section of FIG. 1B, taken along line V-V'.

Figure 3:
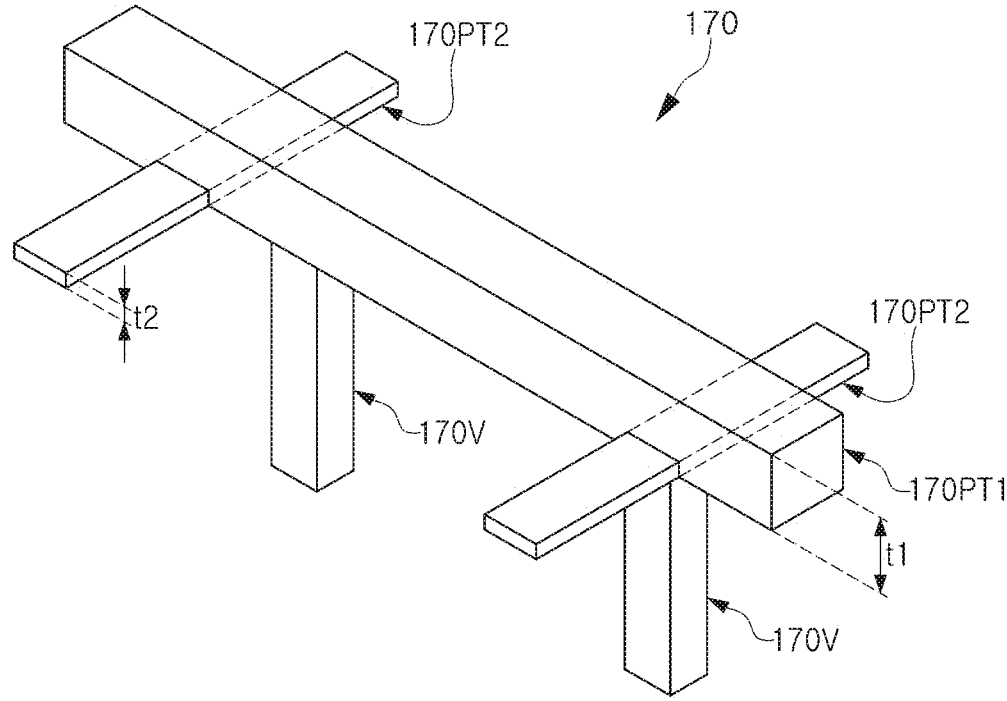
FIG. 3 is a perspective view illustrating some configurations of a semiconductor device according to various example embodiments.

FIG. 3 is a perspective view illustrating some configurations of a semiconductor device according to various example embodiments. FIG. 3 is an enlarged view of the fence structure of FIGS. 1A to 2C.

Referring to FIGS. 1A to 3, a semiconductor device 100 may include a substrate 101 including active regions ACTa and ACTb, word line structures WLS buried and extending in the substrate 101 and including word lines WL, bit line structures BLS on the substrate 101, extending across the word line structures WLS and including bit lines BL, information storage structures 190 disposed above the bit line structures BLS, storage node contacts 160 electrically connecting the information storage structures 190 and active regions ACTa, a fence structure between the storage node contacts 160, landing pads LP electrically connecting the storage node contacts 160 and the information storage structures 190, and a capping insulating layer 180 on the bit line structures BLS. The semiconductor device 100 may further include device isolation layers 110a and 110b defining the active regions ACTa and ACTb, a buffer layer 130 on the substrate 101, and spacer structures SS on both sides of the bit line structures BLS, and a metal-semiconductor layer 165 on each of the storage node contacts 160. The semiconductor device 100 may be applied to, for example, a dynamic random access memory (DRAM) cell array, but is not limited thereto, and may alternatively or additionally be applied to a device using a memristor as a memory element in lieu of or in addition to a capacitor.

In an example embodiment, the substrate 101 of the semiconductor device 100 may include a first region R1 and a second region R2. FIGS. 1A, 2A, and 2B may illustrate elements on the first region R1, and FIGS. 1B and 2C may illustrate elements on the second region R2. For example, the first region R1 may be a memory cell array region, and the second region R2 may be a peripheral circuit region. The semiconductor device 100 may include a word line structure WLS, a bit line structure BLS, an information storage structure 190, a storage node contact 160, a fence structure 170, and landing pads LP on or in the first region R1.

In an example embodiment, the semiconductor device 100 may include a peripheral gate structure PG, a peripheral spacer PS, a peripheral insulating liner 147b, a peripheral insulating layer 182, a peripheral contact plug 183, and peripheral interconnections 184, arranged on the second region R2. The peripheral gate structure PG may further include a peripheral dielectric layer 126, a peripheral gate electrode 127, and a peripheral capping layer 146b, sequentially stacked.

The substrate 101 may have an upper surface extending in X and Y-directions. The substrate 101 may include a semiconductor material, such as a Group IV semiconductor, a Group III-V compound semiconductor, or a Group II-VI compound semiconductor. For example, the group IV semiconductor may include silicon, germanium, or silicon-germanium. The substrate 101 may further include impurities. The substrate 101 may include a silicon substrate, a silicon-on-insulator (SDI) substrate, a germanium substrate, a germanium-on-insulator (GOI) substrate, a silicon-germanium substrate, or a substrate having an epitaxial layer.

The active regions ACTa and ACTb may be defined in the substrate 101 by the device isolation layers 110a and 110b. In an example embodiment, the active regions ACTa and ACTb may include first active regions ACTa defined by first device isolation layers 110a in the first region R1, and second active regions ACTb defined by second device isolation layers 110b in the second region R2.

Each of the first active regions ACTa may have a bar shape and may be disposed in the substrate 101 in an island shape extending in one direction, for example, in a W direction. The W direction may be inclined with respect to directions in which the word lines WL and the bit lines BL extend.

Each of the first active regions ACTa may have first and second impurity regions 105a and 105b at a predetermined depth from the upper surface of the substrate 101. The first and second impurity regions 105a and 105b may be spaced apart from each other. The first and second impurity regions 105a and 105b may serve as a source/drain region of a transistor formed by the word lines WL. For example, the first and second impurity regions 105a and 105b may be cell source/drain regions. For example, a drain region may be formed between two word lines WL crossing one active region ACT, and a source region may be formed outside the two word lines WL, respectively. The source region and the drain region may be formed by first and second impurity regions 105a and 105b by doping or ion implantation of substantially the same impurities, and may be interchangeably referred according to a circuit configuration of a transistor to be finally formed. The impurities may include dopants having a conductivity type opposite to that of the substrate 101. In example embodiments, the depths of the first and second impurity regions 105a and 105b in the source region and the drain region may be different from each other.

Each of the second active regions ACTb may extend in one direction within the second region R2 and may extend in a direction different from that of the first active regions ACTa, but is not limited thereto. Each of the second active regions ACTb may include third and fourth impurity regions 133a and 133b having a predetermined depth from the upper surface of the substrate 101. The third and fourth impurity regions 133a and 133b may be peripheral source/drain regions.

The device isolation layers 110a and 110b may be formed by a shallow trench isolation (STI) process. The device isolation layers 110a and 110b may surround and electrically separate the active regions ACTa and ACTb. For example, the first device isolation layers 110a may electrically separate the first active regions ACTa, and the second device isolation layers 110b may electrically separate the second active regions ACTb. The device isolation layers 110a and 110b may be formed of an insulating material, for example, an oxide, a nitride, or a combination thereof. In an example embodiment, the device isolation layers 110a and 110b may include a plurality of layers.

In an example embodiment, the semiconductor device 100 may further include an insulating support structure 103 extending into the device isolation layers 110a and 110b between the active regions ACTa and ACTb. The insulating support structure 103 may be spaced apart from the active regions ACTa and ACTb. The insulating support structure 103 may include an insulating material, such as silicon nitride, silicon oxynitride, or a combination thereof. The insulating support structure 103 may be a support structure for controlling dispersion in an etching process for forming a gate trench 115. For example, occurrence of depth distribution of the gate trench 115 due to a difference in etching rate between the active regions ACTa and ACTb and the device isolation layers 110a and 110b by the insulating support structure 103 may be improved. For example, the insulating support structure 103 may be disposed in a hole type pillar shape between the first active regions ACTa spaced apart in the W direction. However, the insulating support structure 103 may be modified to have various configurations and arrangement, and may be omitted according to embodiments.

Each of the word line structures WLS may extend in a first horizontal direction, for example, in the X-direction. Each of the word line structures WLS may include a gate dielectric layer 120, a word line WL, and a buried insulating layer 125. The word line structures WLS may be disposed in gate trenches 115 extending in the first region R1 of the substrate 101. The word line structures WLS may be cell gate structures. Therefore, the word line structures WLS, the first impurity region 105a, and the second impurity region 105b may constitute a memory cell transistor.

The word line WL may be disposed to cross the first active regions ACTa in the substrate 101, and extend in one direction, for example, in the X-direction. For example, a pair of word lines WL may be disposed to cross one first active region ACTa. The word line WL may constitute a buried channel array transistor (BCAT), but is not limited thereto. In example embodiments, the word line WL may be also disposed on the substrate 101.

The word line WL may be disposed below the gate trench 115 by a predetermined thickness. An upper surface of the word line WL may be located on a lower level than the upper surface of the substrate 101. In this specification, high and low states of the term "level" may be defined based on a substantially flat upper surface of the substrate 101. The word line WL may be formed of a conductive material such as at least one of polycrystalline silicon (Si), titanium (Ti), titanium nitride (TiN), tantalum (Ta), tantalum nitride (TaN), tungsten (W), tungsten nitride (WN), or aluminum (Al). In example embodiments, the word line WL may include a plurality of layers. For example, the word line WL may include a first word line layer WL1 including a metal material, and a second word line layer WL2 including a doped semiconductor material and having a thickness, thinner than a thickness of the first word line layer WL1, but the number of layers, a material type, and a thickness of the word line WL are not limited thereto, and may be variously changed.

The gate dielectric layer 120 may be disposed on bottom and inner side surfaces of the gate trench 115. The gate dielectric layer 120 may conformally cover inner side walls of the gate trench 115. The gate dielectric layer 120 may include at least one of an oxide, a nitride, or an oxynitride. The gate dielectric layer 120 may be, for example, a silicon oxide layer, or an insulating layer having a high dielectric constant. In example embodiments, the gate dielectric layer 120 may be a layer formed by oxidizing the active region ACT, or may be a layer formed by deposition.

The buried insulating layer 125 may be disposed on the word line WL to fill the gate trench 115. An upper surface of the buried insulating layer 125 may be located on substantially the same level as the upper surface of the substrate 101. The buried insulating layer 125 may include an insulating material, for example, silicon nitride.

The buffer layer 130 may be disposed on the first region R1 of the substrate 101. The buffer layer 130 may be disposed on the first active regions ACTa, the first device isolation layers 110a, and the insulating support structure 103. The buffer layer 130 may cover the word line structures WLS. The buffer layer 130 may be disposed between the substrate 101 and the bit line structures BLS. The storage node contact 160 may pass through the buffer layer 130, and may be electrically connected to the first active region ACTa. The buffer layer 130 may include an insulating material such as silicon oxide, silicon nitride, silicon oxynitride, or a combination thereof. In an example embodiment, the buffer layer 130 may include a plurality of insulating layers including different insulating materials.

Each of the bit line structures BLS may extend in a second horizontal direction, intersecting the first horizontal direction, for example, in the Y-direction, on the first region R1 of the substrate 101. Each of the bit line structures BLS may include a bit line BL and a bit line capping pattern BC on the bit line BL.

The bit line BL may be disposed on the buffer layer 130. In an example embodiment, the bit line BL may include a first conductive pattern 141, a second conductive pattern 142, and a third conductive pattern 143, sequentially stacked. The buffer layer 130 may be disposed between the first conductive pattern 141 and the substrate 101. The first conductive pattern 141 may include a semiconductor material such as polycrystalline silicon. The second conductive pattern 142 may include a metal-semiconductor compound. The metal-semiconductor compound may be, for example, a layer in which a portion of the first conductive pattern 141 is silicidated. For example, the metal-semiconductor compound may include cobalt silicide (CoSi), titanium silicide (TiSi), nickel silicide (NiSi), tungsten silicide (WSi), or other metal silicides, or may include a nitride such as TiSiN. The third conductive pattern 143 may include a metal material such as titanium (Ti), tantalum (Ta), tungsten (W), or aluminum (Al). The number of conductive patterns, a type of material, and/or a stacking order, constituting the bit line BL, may be variously changed according to embodiments.

The bit line capping pattern BC may be disposed on the third conductive pattern 143. The bit line capping pattern BC may include an insulating material, for example, a nitride-based material such as silicon nitride, silicon oxynitride, silicon carbonitride, or the like. In an example embodiment, the bit line capping pattern BC may include a first capping pattern 146a, a second capping pattern 147a, and a third capping pattern 148, sequentially stacked. The second capping pattern 147a may have a thickness, thinner than a thickness of each of the first capping pattern 146a and the third capping pattern 148. The first to third capping patterns 146a, 147a, and 148 may include different materials, or even when they include the same material, a boundary may be distinguished by a difference in properties, a fine oxide film, or the like. A bit line contact DC may pass through the buffer layer 130, and may be in contact with the first impurity region 105a of the first active region ACTa. The bit line BL may be electrically connected to the first impurity region 105a through the bit line contact DC. The bit line contact DC may be locally disposed in a bit line contact opening DCO exposing the first impurity region 105a.

In an example embodiment, the bit line contact opening DCO may be a reverse type opening formed by exposing the buffer layer 130, the first active regions ACTa, and the first device isolation layers 110a using a hole type mask, in a region in which the mask is not disposed, and exposing at least a portion of the first impurity region 105a. For example, the reverse type opening may mean an opening formed by disposing mask patterns spaced apart from each other on a region, other than the first impurity region 105a, and then performing an etching process. In some embodiments, the bit line contact opening DCO may also be formed as a hole type opening corresponding to the first impurity region 105a or a linear type opening including the first impurity region 105a and extending obliquely.

The bit line contact DC may be configured to have a shape including a portion integrally connected to the bit line BL and extending into the bit line contact opening DCO. Therefore, the bit line contact DC may include the same material as the first conductive pattern 141 of the bit line BL, for example, polysilicon. A lower surface of the bit line contact DC may be located on a lower level than the upper surface of the substrate 101, and may be located on a higher level than an upper surface of the word line WL. The bit line contact DC may be spaced apart from the storage node contact 160 by the spacer structures SS.

The spacer structures SS may include a lower spacer 155 surrounding a portion of a side surface of the bit line contact DC, and upper spacers 151, 152, and 153 disposed on both side walls of each of the bit line structures BLS and extending in one direction, for example, in the Y-direction.

The upper spacers 151, 152, and 153 may separate the storage node contact 160 and the bit line structures BLS, and the lower spacer 155 may separate the storage node contact 160 and the bit line contact DC.

The lower spacer 155 may include an insulating material such as silicon oxide, silicon nitride, silicon oxynitride, a low dielectric material, or a combination thereof. The lower spacer 155 is illustrated as being one layer, but may be formed as two or more layers. The lower spacer 155 may include, for example, a first lower spacer formed of silicon nitride and a second lower spacer formed of silicon oxide.

The upper spacers 151, 152, and 153 may be disposed to extend along side walls of the bit line BL and side walls of the bit line capping pattern BC. A pair of upper spacers 151, 152, and 153 disposed on both sides of one bit line structure BLS may have an asymmetrical shape with respect to the bit line structure BLS. The asymmetrical shape may be formed by the capping insulating layer 180. An upper spacer structure US may include an insulating material such as silicon oxide or silicon nitride. The upper spacers 151, 152, and 153 may include a first upper spacer 151, a second upper spacer 152, and a third upper spacer 153, sequentially stacked from the side walls of the bit line BL. The first upper spacer 151 may have a conformal thickness, and may cover a bottom surface and a portion of an outer side surface of the bit line contact opening DCO. The first upper spacer 151 may include a portion extending from a side surface of the bit line BL to a side surface of the bit line contact DC. In this case, the portion of the first upper spacer 151 may be disposed between the lower spacer 155 and the bit line contact DC. The second upper spacer 152 may be disposed on a side wall of the first upper spacer 151 on the lower spacer 155. The third upper spacer 153 may include a lower end portion disposed on a side wall of the second upper spacer 152 and extending on a level lower than a lower end of the second upper spacer 152. For example, the first upper spacer 151 may include silicon nitride, the second upper spacer 152 may include silicon oxide or may be an air spacer, and the third upper spacer 153 may include silicon nitride.

The peripheral gate structure PG may extend in one direction on the second region R2 of the substrate 101. The one direction may be a direction, intersecting the second active regions ACTb. The third and fourth impurity regions 133a and 133b may be located on both sides of the peripheral gate structure PG. Therefore, the peripheral gate structure PG, the third impurity region 133a, and the fourth impurity region 133b may constitute a peripheral transistor. The peripheral gate electrode 127 may be disposed on the substrate 101 to have a predetermined thickness. The peripheral gate electrode 127 may include a plurality of layers including a conductive material. In an example embodiment, the peripheral gate electrode 127 may include a first peripheral conductive pattern 127a, a second peripheral conductive pattern 127b, and a third peripheral conductive pattern 127c, sequentially stacked. The first peripheral conductive pattern 127a may include a semiconductor material such as polycrystalline silicon. The second peripheral conductive pattern 127b may include a metal-semiconductor compound. The third peripheral conductive pattern 127c may include a metal material such as titanium (Ti), tantalum (Ta), tungsten (W), or aluminum (Al). Each of the first to third peripheral conductive patterns 127a, 127b, and 127c may correspond to the first to third conductive patterns 141, 142, and 143, to have the same material or to have the same or similar thickness. The number of peripheral conductive patterns, a type of material, and/or a stacking order, constituting the peripheral gate electrode, may be variously changed according to embodiments.

The peripheral dielectric layer 126 may be disposed between the peripheral gate electrode 127 and the substrate 101. The peripheral dielectric layer 126 may be formed to have the same or similar width as the peripheral gate electrode 127. The peripheral dielectric layer 126 may be a silicon oxide film, or an insulating film having a high dielectric constant.

The peripheral capping layer 146b may be disposed on the peripheral gate electrode 127. The peripheral capping layer 146b may be formed to have the same or similar width as the peripheral gate electrode 127. The peripheral capping layer 146b may include the same material as the first capping pattern 146a. A thickness of the peripheral capping layer 146b may be substantially the same as a thickness of the first capping pattern 146a. An upper surface of the peripheral capping layer 146b may be located on substantially the same level as an upper surface of the first capping pattern 146a. This may be because the first capping pattern 146a and the peripheral capping layer 146b are formed by the same deposition process.

The peripheral spacer PS may be a structure covering both side surfaces of the peripheral gate structure PG. The peripheral spacer PS may include an insulating material such as silicon oxide, silicon nitride, or a combination thereof. In an example embodiment, the peripheral spacer PS may include a first peripheral spacer PS1 on a side surface of the peripheral gate structure PG and a second peripheral spacer PS2 on the first peripheral spacer PS1. The peripheral spacer PS1 may include silicon nitride, and the second peripheral spacer PS2 may include silicon oxide. The number and types of materials constituting the peripheral spacer PS are not limited thereto, and may be variously changed.

The peripheral insulating liner 147b may have a conformal thickness, and may cover the peripheral gate structure PG and the peripheral spacer PS on the second region R2. The thickness may be substantially the same as a thickness of the second capping pattern 147a. The peripheral insulating liner 147b may include the same material as the second capping pattern 147a. This may be because the second capping pattern 147a and the peripheral insulating liner 147b are formed by the same deposition process.

The peripheral insulating layer 182 may cover the peripheral gate structure PG and the peripheral insulating liner 147b. The peripheral insulating layer 182 may include, for example, silicon oxide.

The peripheral contact plug 183 may pass through the peripheral insulating layer 182 and the peripheral insulating liner 147b, to contact the third and fourth impurity regions 133a and 133b. The peripheral interconnections 184 may be connected to the peripheral contact plug 183 on the peripheral insulating layer 182. The peripheral interconnections 184 may include at least one interconnection layer and interconnection vias connected to the interconnection layer.

The storage node contacts 160 may be connected to one region of the first active regions ACTa, for example, the second impurity region 105b. The storage node contacts 160 may be disposed between adjacent bit line structures BLS in the X-direction, in particular, between spacer structures SS on both sides of the bit line structures BLS, when viewed from a plan view. When viewed from a plan view, each of the storage node contacts 160 may be disposed between word line structures WLS and bit line structures BLS. Each of the storage node contacts 160 may fill a space defined by the bit line structures BLS adjacent in the X-direction and the fence structure 170 adjacent in the Y-direction. The storage node contacts 160 may be arranged in columns and rows in the X and Y-directions.

The storage node contacts 160 may pass through the buffer layer 130, and may electrically connect the second impurity regions 105b of the first active regions ACTa to the information storage structure 190. The storage node contacts 160 may directly contact the second impurity region 105b. A lower end of the storage node contact 160 may be located on a level, lower than the upper surface of the substrate 101, and may be located on a level, higher than a lower surface of the bit line contact DC. The storage node contact 160 may be insulated from the bit line contact pattern DC by the spacer structure SS.

The storage node contact 160 may be formed of a conductive material, and may include, for example, at least one of polycrystalline silicon (Si), titanium (Ti), titanium nitride (TiN), tantalum (Ta), tantalum nitride (TaN), tungsten (W), tungsten nitride (WN), or aluminum (Al). In an example embodiment, the storage node contact 160 may include a plurality of layers.

The metal-semiconductor layer 165 may be disposed between the storage node contact 160 and the landing pad LP. The metal-semiconductor layer 165 may cover an upper surface of the storage node contact 160. The metal-semiconductor layer 165 may be, for example, a layer in which a portion of the storage node contact 160 is silicided. For example, the metal-semiconductor layer 165 may include cobalt silicide (CoSi), titanium silicide (TiSi), nickel silicide (NiSi), tungsten silicide (WSi), or other metal silicide. According to embodiments, the metal-semiconductor layer 165 may be omitted.

The fence structure 170 may be disposed between the storage node contacts 160 on the first region R1 of the substrate 101, to space the storage node contacts 160 apart from each other. The fence structure 170 may include at least one of an insulating material, e.g., silicon nitride, silicon oxynitride, or silicon carbonitride.

In an example embodiment, the fence structure 170 may include first line pattern portions 170PT1 extending in the first horizontal direction, second line pattern portions 170PT2 extending in the second horizontal direction, and pillar portions 170V separating the storage node contacts 160. The first line pattern portions 170PT1, the second line pattern portions 170PT2, and the pillar portions 170V may be integrally connected. The pillar portions 170V may be portions formed to separate nodes of adjacent storage node contacts 160. The first line pattern portions 170PT1 may have a structure formed by removing portions of the bit line capping pattern BC or the like by an etching process for forming the pillar portions 170V. The second line pattern portions 170PT2 may correspond to a sacrificial buffer layer 119 (see FIG. 6A) for protecting the bit line BL.

The pillar portions 170V may be spaced apart from each other in the Y-direction, which may be the second horizontal direction, between a plurality of bit line structures BLS. The storage node contact 160 may be in contact with the pillar portions 170V between adjacent pillar portions 170V. The pillar portions 170V may pass through the buffer layer 130, and may extend into the buried insulating layer 125 by a predetermined depth. Lower ends of the pillar portions 170V may be located on a lower level than a lower surface of the bit line BL, and may be located on a higher level than an upper surface of the word line WL.

Each of the first line pattern portions 170PT1 may extend on a higher level than the bit line BL, in the X-direction, which may be the first horizontal direction, and may overlap the word line structures WLS in plan view. In an example embodiment, the first line pattern portions 170PT1 may be disposed on an upper surface of the second capping pattern 147a. The pillar portions 170V may protrude from lower portions of the first line pattern portions 170PT1 toward the substrate 101. Upper surfaces of the first line pattern portions 170PT1 may be flat. The upper surfaces of the first line pattern portions 170PT1 may be located on substantially the same level as upper surfaces of the bit line capping patterns BC.

Each of the second line pattern portions 170PT2 may overlap the bit line structures BLS in plan view while extending in the Y-direction, which may be the second horizontal direction. In an example embodiment, all of the second line pattern portions 170PT2 may overlap the bit line BL in the Z-direction. The second line pattern portions 170PT2 may extend to cross the first line pattern portions 170PT1.

Referring to FIG. 3, a first thickness t1 of each of the first line pattern portions 170PT1 may be thicker than a second thickness t2 of each of the second line pattern portions 170PT2. In this specification, 'thickness' may mean a maximum length or an average length of a corresponding configuration in the Z-direction, perpendicular to the substrate 101. In one example, the second thickness t2 may range from about 10 Å (1 nm) to about 100 Å (10 nm), and in another example, the second thickness t2 may range from about 40 Å (4 nm) to about 60 Å (6 nm).

The second line pattern portions 170PT2 may be integrally connected to lower regions of the first line pattern portions 170PT1, to connect the lower regions to each other. Therefore, the upper surfaces of the first line pattern portions 170PT1 may be located on a higher level than upper surfaces of the second line pattern portions 170PT2.

The second line pattern portions 170PT2 may be located on a level, lower than upper surfaces of the bit line structures BLS and higher than lower surfaces of the bit line structures BLS. The second line pattern portions 170PT2 may pass through the bit line capping pattern BC in the Y-direction, which may be the second horizontal direction, in which the bit line structures BLS extend. A width of the second line pattern portions 170PT2 in the X-direction may be substantially the same as a width of the bit line capping pattern BC in the X-direction. In an example embodiment, the second line pattern portions 170PT2 may extend between the second capping pattern 147a and the third capping pattern 148 in the Y-direction. The second line pattern portions 170PT2 may be located on a higher level than the second capping pattern 147a. The second line pattern portions 170PT2 may separate the second capping pattern 147a and the third capping pattern 148 from each other. The second line pattern portions 170PT2 may have side surfaces coplanar with respective side surfaces of the second capping pattern 147a and the third capping pattern 148.

The second line pattern portions 170PT2 may be located on a higher level than the storage node contact 160.

Referring to FIG. 2A, the bit line structure BLS may include a first bit line structure BLS1 and a second bit line structure BLS2, disposed adjacent to each other, and the spacer structures SS may include first spacer structures SS1 disposed on both side walls of the first bit line structure BLS1, and second spacer structures SS2 disposed on both side walls of the second bit line structure BLS2. At least a portion of the fence structure 170, e.g., the pillar portions 170V, may extend between the first and second spacer structures SS1 and SS2 in the Z-direction. At least a portion of the fence structure 170, for example, the second line pattern portions 170PT2, may extend between the first spacer structures SS1 in the Y-direction or may extend between the second spacer structures SS2 in the Y-direction.

The spacer structures SS may have a first portion SS_P1 covered by the fence structure 170, and a second portion SS_P2 having an upper surface on a higher level than the first portion SS_P1. One spacer structure SS may be disposed such that the first portion SS_P1 and the second portion SS_P2 are alternately located in the Y-direction.

In this specification, a portion of the first line pattern portion 170PT1 overlapping the second line pattern portion 170PT2 in the Z-direction may be referred to as a "protrusion," the second line pattern portion 170PT2 may be referred to as a "line pattern portion," and the fence structure 170 may be referred to as an "insulation structure." For example, the first line pattern portion 170PT1 of line IV-IV' of FIG. 2B may correspond to the protrusion. In this case, the protrusion may have a portion integrally connected to the line pattern portion, protruding in the Z-direction, and overlapping the word line structures WLS in the Z-direction.

The landing pad LP may electrically connect the storage node contact 160 and the information storage structure 190.

The landing pad LP may be disposed between the pair of bit line structures BLS and on the storage node contact 160. The landing pad LP may cover an upper surface of the metal-semiconductor layer 165. The landing pad LP may be in contact with side walls of the spacer structures SS. The landing pad LP may pass through the capping insulating layer 180, and may be in contact with the capping insulating layer 180.

In an example embodiment, there may be a plurality of landing pads LP, and the plurality of landing pads LP may be arranged in a hexagonal or honeycomb grid pattern. Arrangement of the plurality of landing pads LP may correspond to arrangement of the information storage structures 190.

In an example embodiment, the landing pad LP may have a double-layer structure including a conductive layer and a barrier layer covering lower and side surfaces of the conductive layer. The conductive layer may include a conductive material, for example, at least one of polycrystalline silicon (Si), titanium (Ti), tantalum (Ta), tungsten (W), or aluminum (Al), and the barrier layer may include a metal nitride, for example, may include at least one of titanium nitride (TiN), tantalum nitride (TaN), or tungsten nitride (WN). According to embodiments, the number and shapes of landing pads LP may be variously changed.

The capping insulating layer 180 may be disposed on the bit line structure BLS. The capping insulating layer 180 may be disposed to contact the bit line structures BLS, the spacer structures SS, and the landing pad LP. In an example embodiment, the capping insulating layer 180 may be disposed between each of the plurality of landing pads LP. The capping insulating layer 180 may have lower ends contacting upper surfaces of the spacer structures SS.

The information storage structure 190 may be disposed on the bit line structure BLS to contact the landing pad LP. The information storage structure 190 may include a lower electrode 192, an upper dielectric layer 194, and an upper electrode 196. The lower electrode 192 and the upper electrode 196 may include at least one of a doped semiconductor, a metal nitride, a metal, or a metal oxide. The lower electrode 192 and the upper electrode 196 may include, for example, at least one of polycrystalline silicon, titanium nitride (TiN), tungsten (W), titanium (Ti), ruthenium (Ru), or tungsten nitride (WN). The upper dielectric layer 194 may include, for example, at least one of high dielectric constant materials such as zirconium oxide ($ZrO_2$), aluminum oxide ($Al_2O_3$), or hafnium oxide ($Hf_2O_3$). In FIGS. 2A to 2C, the information storage structure 190 is illustrated as having a pillar shape, but is not limited thereto and may have a cylinder shape.

Next, various modifications of a fence structure 170, bit line structures BLS, and spacer structures SS according to various example embodiments will be described with reference to FIGS. 4A to 4C.

Figure 4A:
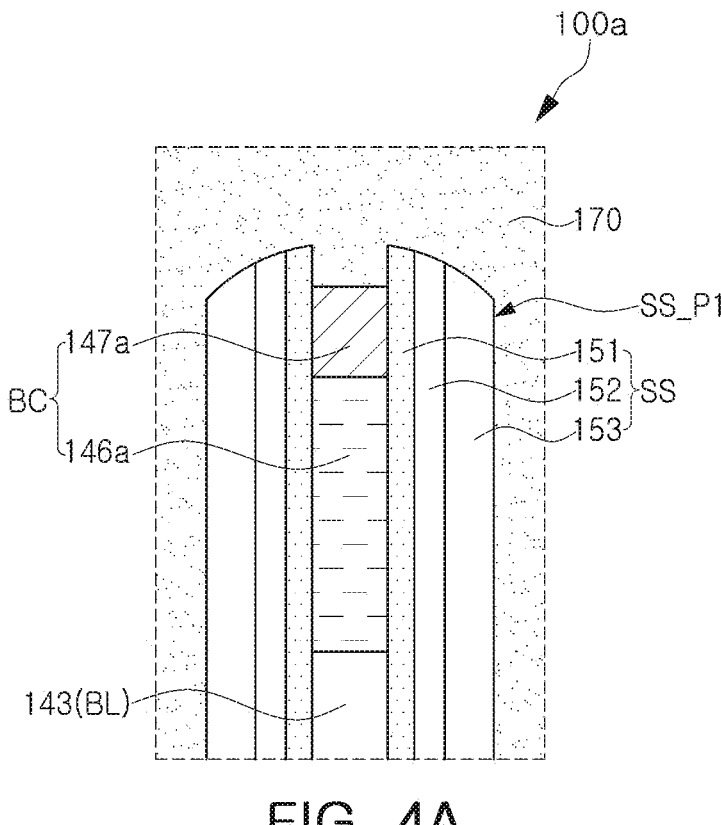
FIGS. 4A to 4C are partially enlarged cross-sectional views of a semiconductor device according to various example embodiments.
Figure 4B:
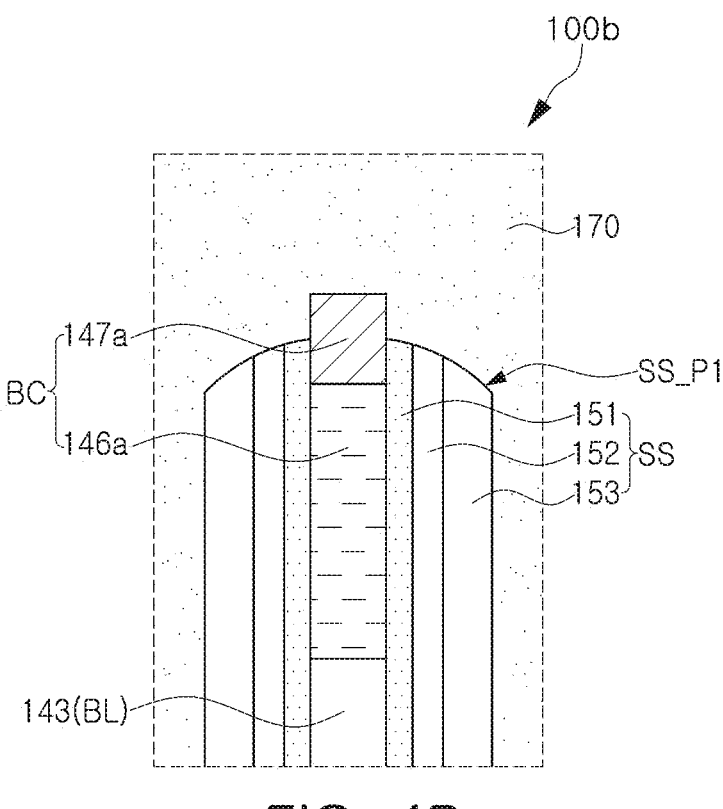
Figure 4C:
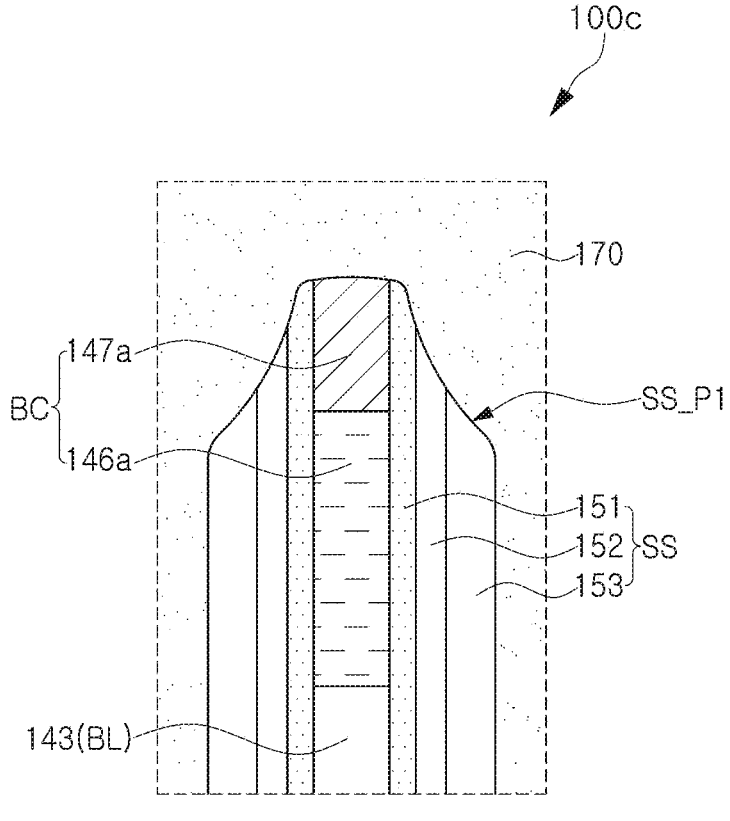

FIGS. 4A to 4C are partially enlarged cross-sectional views of a semiconductor device according to various example embodiments. FIGS. 4A to 4C are enlarged views of portion 'A' of FIG. 2A.

Referring to FIG. 4A, in a semiconductor device 100a, an upper end of a first portion SS_P1 covered by a fence structure 170, among spacer structures SS, may be located on a different level from an upper surface of a second capping pattern 147a. The upper end of the first portion SS_P1 may protrude upwardly from the upper surface of the second capping pattern 147a. This may be a structure resulting from a process of forming and/or removing a sacrificial buffer layer 119 (see FIG. 6A). For example, as the sacrificial buffer layer 119 may be selectively removed by a selective etching process or a cleaning process of FIGS. 11A and 11B, the upper surface of the second capping pattern 147a may be disposed on the upper surface of the second capping pattern 147a, to have a level, different from that of upper ends of the spacer structures SS.

Figure 10A:
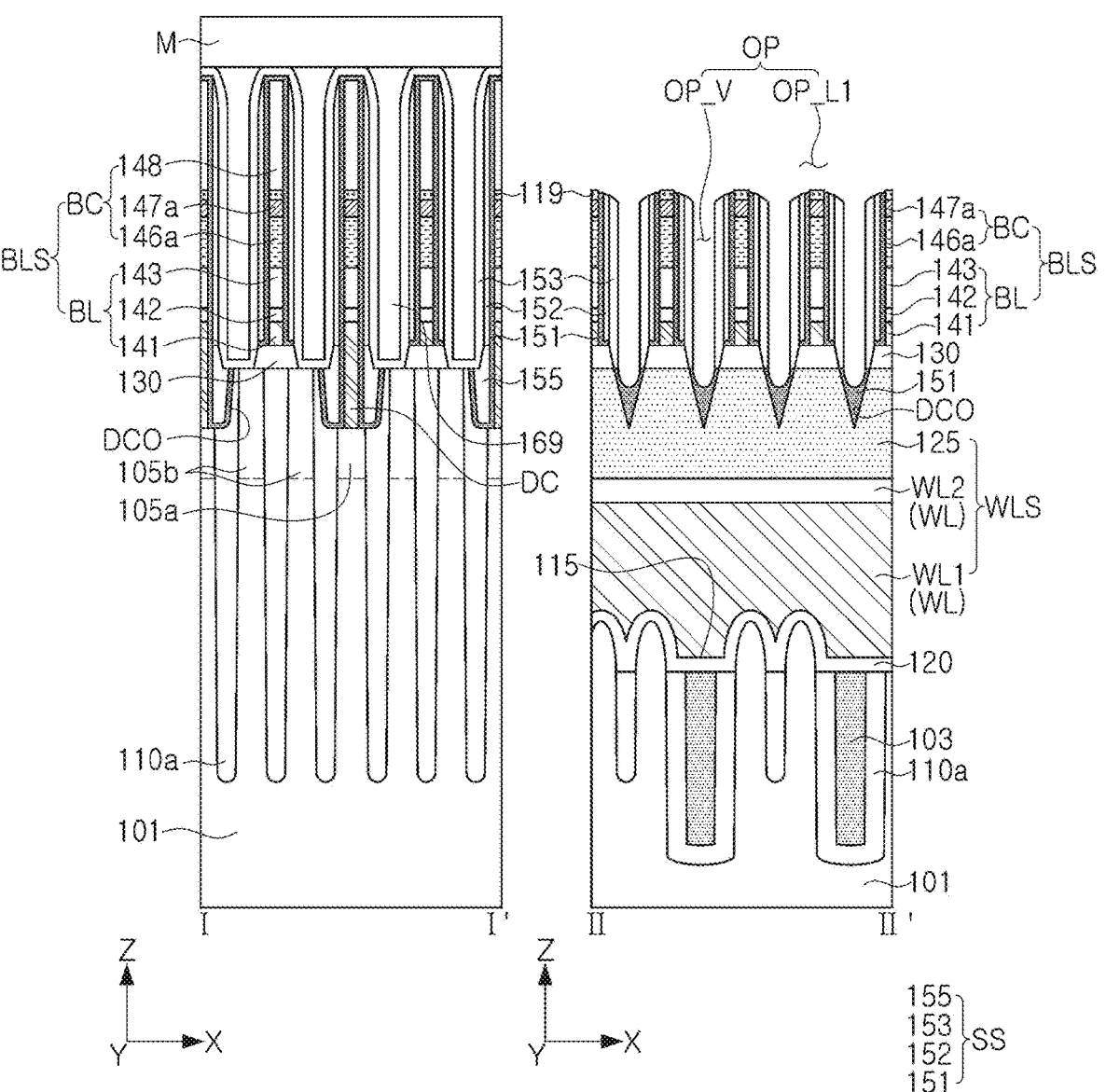

Referring to FIG. 4B, in a semiconductor device 100b, an upper end of a first portion SS_P1 of spacer structures SS may be located on a lower level than an upper surface of a second capping pattern 147a. For example, the spacer structures SS may expose at least a portion of a side surface of the second capping pattern 147a. This may be a structure formed by removing a relatively large number of spacer structures SS in an anisotropic etching process of FIG. 10A, compared to FIG. 4A.

Referring to FIG. 4C, in the semiconductor device 100c, an upper end of a first portion SS_P1 of spacer structures SS may be located on substantially the same level as an upper surface of a second capping pattern 147a. The spacer structures SS may be formed to include at least one of a convex side surface and/or a concave side surface while completely covering the side surfaces of the second capping pattern 147a. This may be a structure caused by different types of materials of first to third upper spacers 151, 152, and 153. Shapes of the side surfaces of the spacer structures SS may be variously changed according to types of materials and the number of layers of the upper spacers 151, 152, and 153.

FIGS. 5A to 12B are schematic cross-sectional views illustrating a method of manufacturing a semiconductor device according to various example embodiments. FIGS. 5A, 6A, 7A, 8A, 9A, 10A, 11A, and 12A illustrate cross-sections of FIG. 1A, taken along lines I-I' and II-II', FIGS. 5B, 6B, 7B, 8B, 9B, 10B, 11B, and 12B illustrate cross-sections of FIG. 1A, taken along lines III-III' and IV-IV', and FIGS. 5C, 6C, 7C, 8C, 9C, and 10C illustrate cross-sections of FIG. 1B, taken along line V-V'.

Figure 5A:
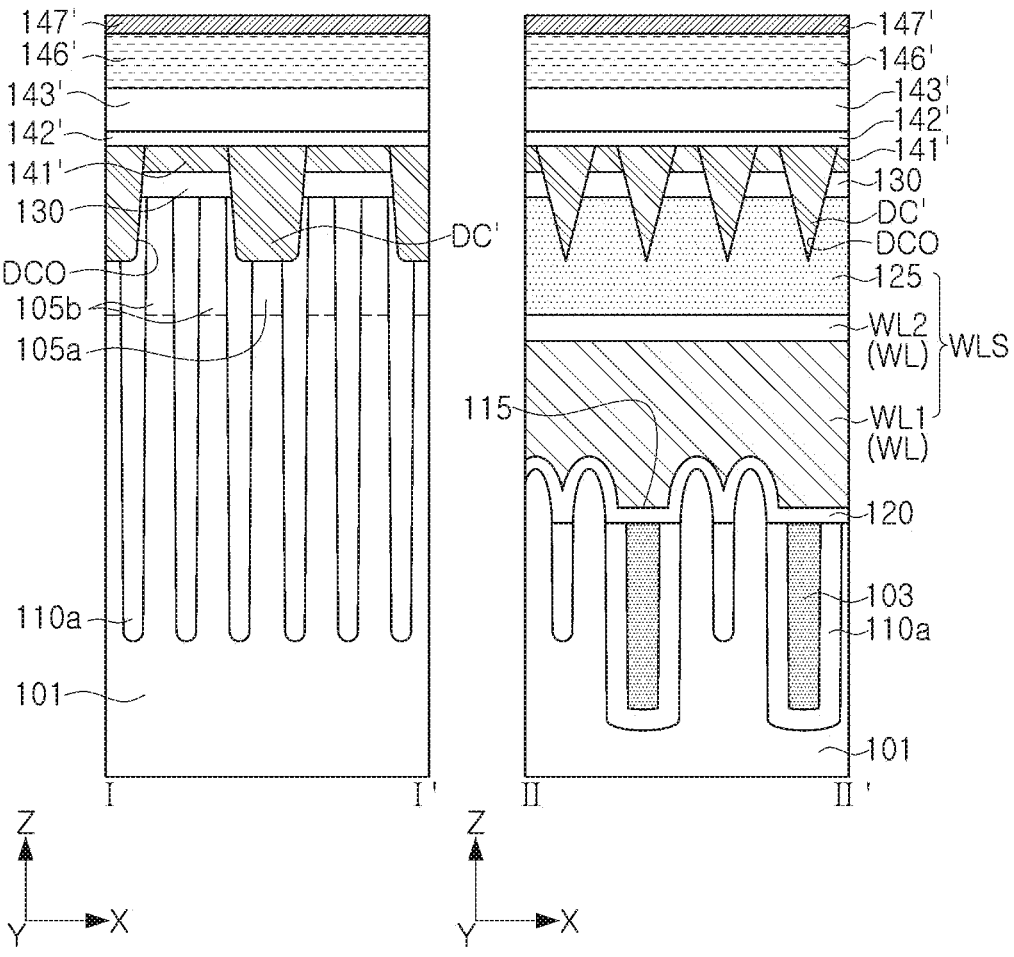
FIGS. 5A to 12B are schematic cross-sectional views illustrating a method of manufacturing a semiconductor device according to various example embodiments.
Figure 5B:
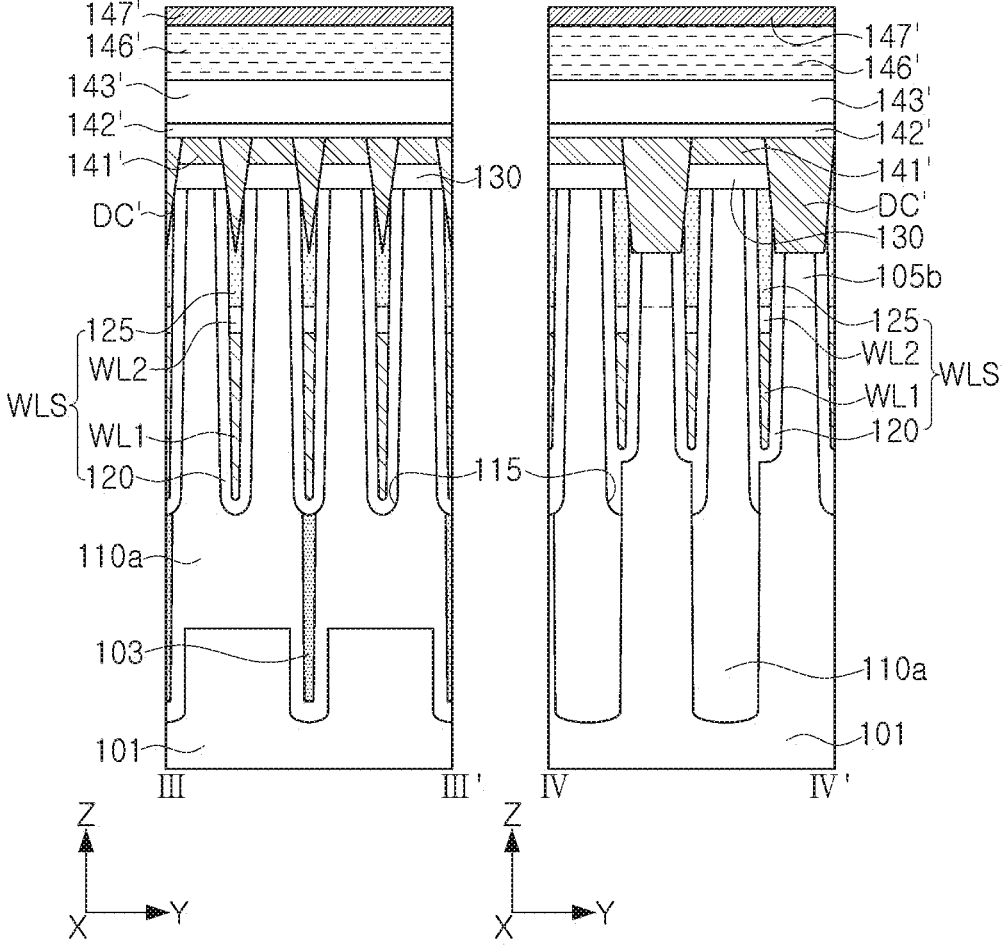
Figure 5C:
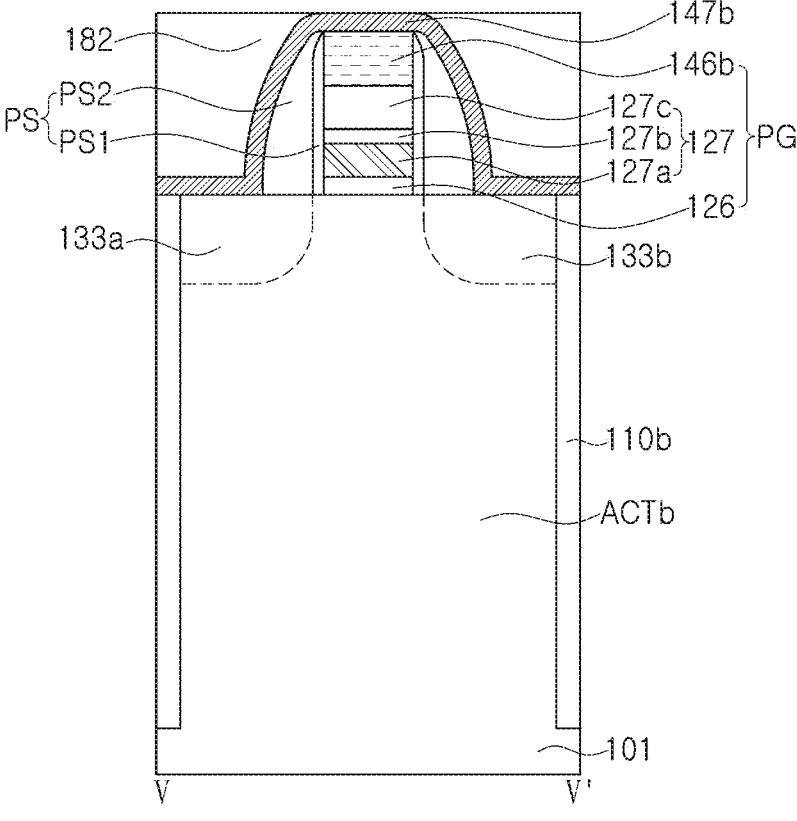

Referring to FIGS. 5A to 5C, device isolation layers 110a and 110b defining active regions ACTa and ACTb may be formed in a substrate 101, and word line structures WLS may be formed in the substrate 101, and a first conductive layer 141', a bit line contact DC, a second conductive layer 142', a third conductive layer 143', a first capping layer 146', and a second capping layer 147' may be formed.

First, a substrate 101 including a semiconductor material may be prepared. The substrate 101 may include a first region R1 and a second region R2. The first region R1 may be a memory cell array region, and the second region R2 may be a peripheral circuit region.

Active regions ACTa and ACTb and device isolation layers 110a and 110b may be formed on the substrate 101. According to a shallow trench isolation (STI) process, the substrate 101 may be anisotropically etched to form trenches, insulating materials may be deposited in the trenches, and then the device isolation layers 110a and 110b may be formed by performing a planarization process. First active regions ACTa may be defined by first device isolation layers 110a in the first region R1, and second active regions ACTb may be defined by second device isolation layers 110b in the second region R2. Lengths, widths, arrangement relationships, or the like of the first active regions ACTa and the second active regions ACTb may be different from each other. Before forming the device isolation layers 110a and 110b, impurities may be implanted into the substrate 101 to form first and second impurity regions 105a and 105b and/or third and fourth impurity regions 133a and 133b. According to embodiments, the first and second impurity regions 105a and 105b and/or the third and fourth impurity regions 133a and 133b may be formed after forming the device isolation layers 110a and 110b, or may be formed in another process.

Next, in the first region R1 of the substrate 101, the substrate 101 may be anisotropically etched to form gate trenches 115 in which word lines WL are disposed. The gate trenches 115 may extend in the X-direction, and may cross the first active regions ACTa and the first device isolation layers 110a. In the gate trenches 115, a gate dielectric layer 120, a word line WL, and a buried insulating layer 125 may be sequentially formed. The gate dielectric layer 120 may be formed to have a substantially uniform thickness on inner side walls and bottom surfaces of the gate trenches 115. The gate dielectric layer 120 may be formed by an oxidation process of the first active regions ACTa or a deposition process of a dielectric material. The word lines WL may be formed by depositing a conductive material in the gate trenches 115 and recessing the gate trenches 115 by a predetermined depth. Each of the word lines WL may include a first word line WL1 formed by depositing and etching a metal material, and a second word line WL2 formed by depositing and etching a semiconductor material, but a formation method of the word line may be variously changed. The buried insulating layer 125 may be formed by depositing an insulating material to fill the remainder of the gate trench 115 and then performing a planarization process. As a result, word line structures WLS may be formed. An insulating support structure 103 may be formed by forming an opening between the first active regions ACTa and filling the insulating material therein before forming the word line structures WLS.

A buffer layer 130, a first conductive layer 141', a bit line contact DC', a second conductive layer 142', a third conductive layer 143', a first capping layer 146', and a second capping layer 147' may be sequentially formed on the first region R1. Before forming the first conductive layer 141', the buffer layer 130 conformally covering the first active regions ACTa and the first device isolation layers 110a may be formed. The buffer layer 130 may include, for example, at least one of SiN, SiOC, SiO, SiCN, SiON, or SiOCN. The buffer layer 130 is illustrated as a single layer, but may be formed as a plurality of layers having different materials by a plurality of deposition processes. Next, a semiconductor material may be deposited to form the first conductive layer 141', and the first conductive layer 141' and the buffer layer 130 may be patterned, to form a bit line contact opening DCO respectively exposing the first impurity regions 105a of the first active regions ACTa, and the bit line contact DC' may be formed by depositing a semiconductor material in the bit line contact opening DCO and performing a planarization process thereon. In an example embodiment, the semiconductor material of the first conductive layer 141' and the semiconductor material of the bit line contact DC' may be the same material, but may include different materials according to embodiments. Next, the second conductive layer 142' having a metal-semiconductor compound material, the third conductive layer 143' having a metal material, the first capping layer 146', and the second capping layer 147' may be formed sequentially. Each of the first capping layer 146' and the second capping layer 147' may include an insulating material, for example, a nitride-based material such as silicon nitride, silicon oxynitride, or silicon carbonitride.

A peripheral gate structure PG, a peripheral spacer structure PS, and a peripheral insulating layer 182 may be sequentially formed on the second region R2. A peripheral dielectric layer 126, a first peripheral conductive pattern 127a, a second peripheral conductive pattern 127b, a third peripheral conductive pattern 127c, and a peripheral capping layer 146b, sequentially deposited, may be patterned to form the peripheral gate structure PG. The peripheral dielectric layer 126 may be a dielectric layer formed by using at least a portion of a deposition process for forming the buffer layer 130, but may be a layer formed by performing a separate deposition process on the second region R2. Each of the first to third peripheral conductive patterns 127a, 127b, and 127c may be a layer formed together with each of the first to third conductive layers 141', 142', and 143'. Therefore, each of the first to third peripheral conductive patterns 127a, 127b, and 127c may be formed to have the same material as the first to third conductive layers 141', 142', and 143', respectively, and the first to third conductive layers 127a, 127b, and 127c may be formed to have the same or a similar thickness as each of the three conductive layers 141', 142', and 143'. The peripheral capping layer 146b may be a layer formed by the patterning, after performing the same deposition process as the first capping layer 146'. Next, the peripheral spacer structure PS covering both side surfaces of the peripheral dielectric layer 126, both side surfaces of a peripheral gate electrode 127, and both side surfaces of the peripheral capping layer 146*b* may be formed, and a deposition process may be performed to form a peripheral insulating liner 147*b* covering the peripheral gate structure PG and the peripheral spacer structure PS. The peripheral insulating liner 147*b* may be a layer formed by performing the same deposition process as the second capping layer 147'. Therefore, the peripheral insulating liner 147*b* may have the same material as the second capping layer 147', and may have substantially the same thickness as the second capping layer 147'. Next, the peripheral insulating layer 182 covering the peripheral insulating liner 147*b* may be formed by performing a deposition process and a planarization process. The periph- eral insulating layer 182 may include an insulating material, for example, silicon oxide. A portion of the peripheral insulating liner 147*b* on the second region R2 may be exposed by the planarization process.

Figure 6A:
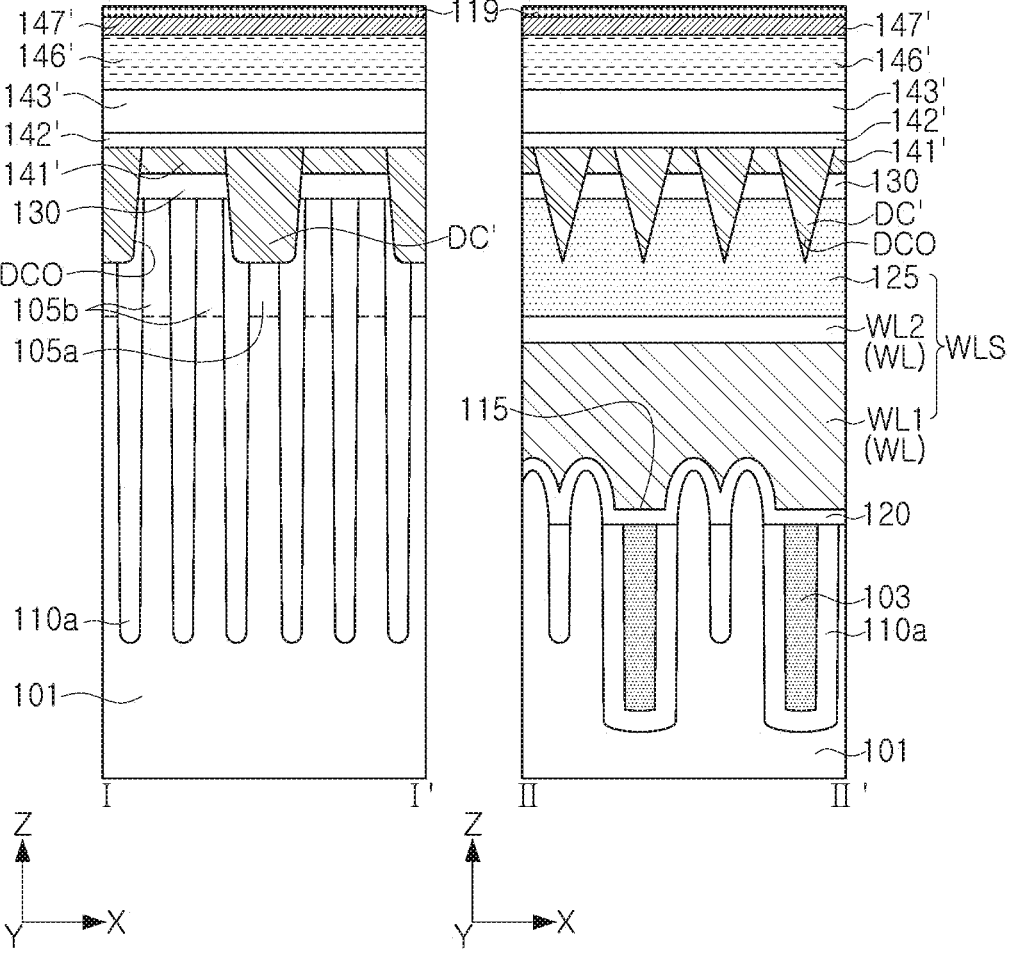
Figure 6B:
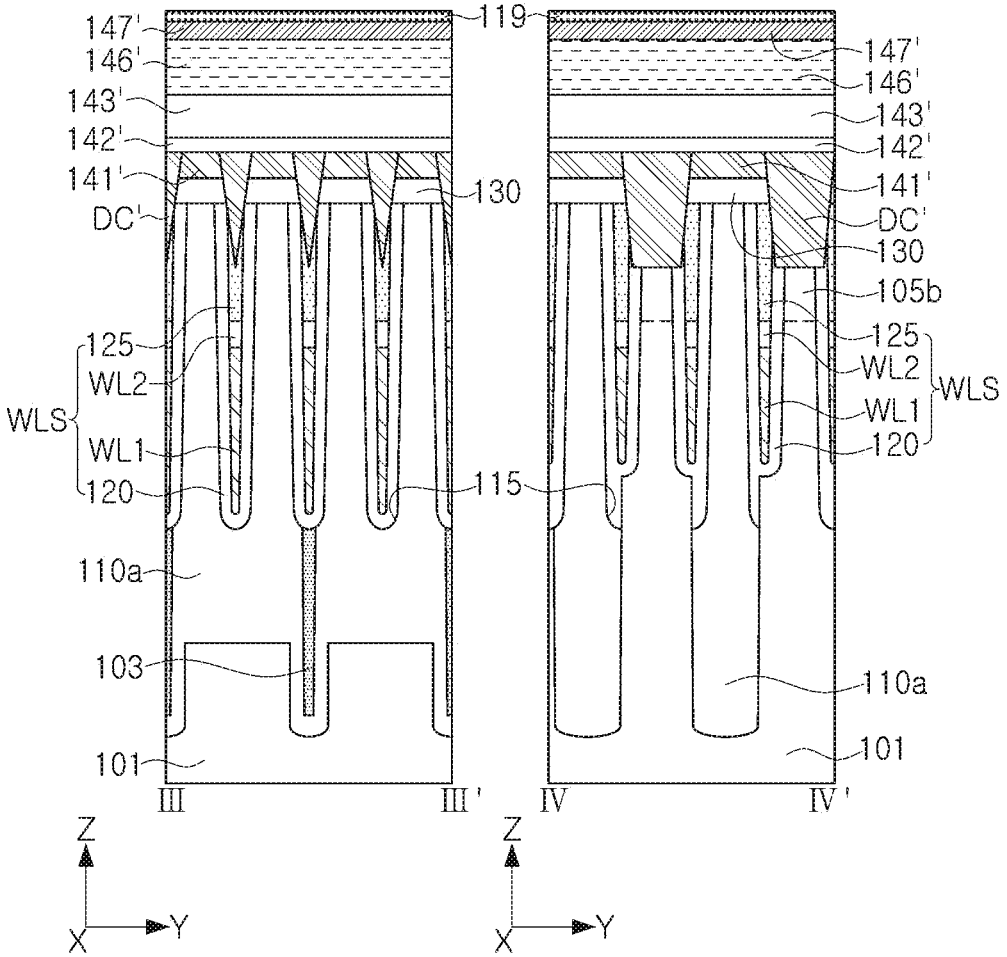
Figure 6C:
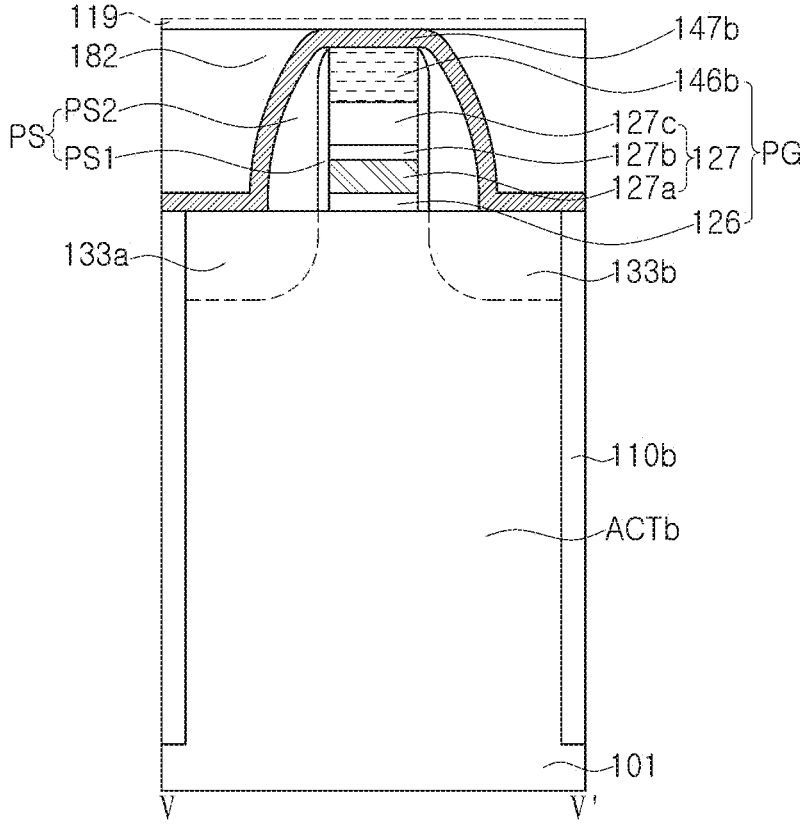

Referring to FIGS. 6A to 6C, a sacrificial buffer layer 119 may be formed on the first region R1.

A deposition process may be performed to cover the second capping layer 147' on the first region R1, and the peripheral insulating liner 147*b* and the peripheral insulating layer 182 on the second region R2, to form the sacrificial buffer layer 119 having a conformal thickness. The thickness of the sacrificial buffer layer 119 may range from about 10 angstroms to about 100 angstroms. The sacrificial buffer layer 119 may be a material having a high etch selectivity with respect to at least one of the first capping layer 146' or the second capping layer 147' under a specific etching condition. For example, the sacrificial buffer layer 119 may include a metal nitride such as TiN, a metal oxide such as HfO, ZrO, or TiO, or a semiconductor material such as SiGe. Next, an etching process using a mask may be performed to remove the sacrificial buffer layer 119 on the second region R2 while leaving the sacrificial buffer layer 119 on the first region R1.

Figure 7A:
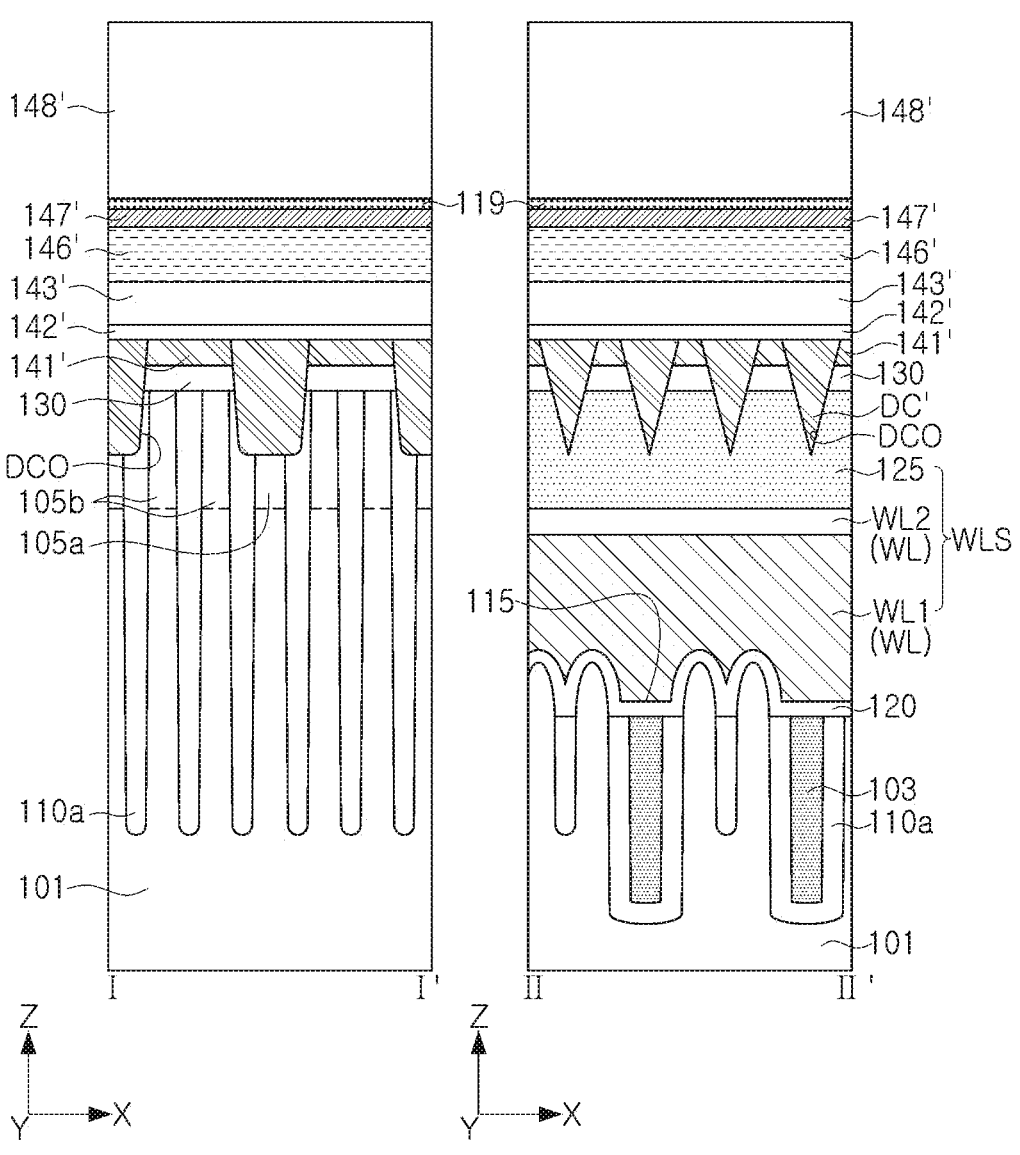
Figure 7B:
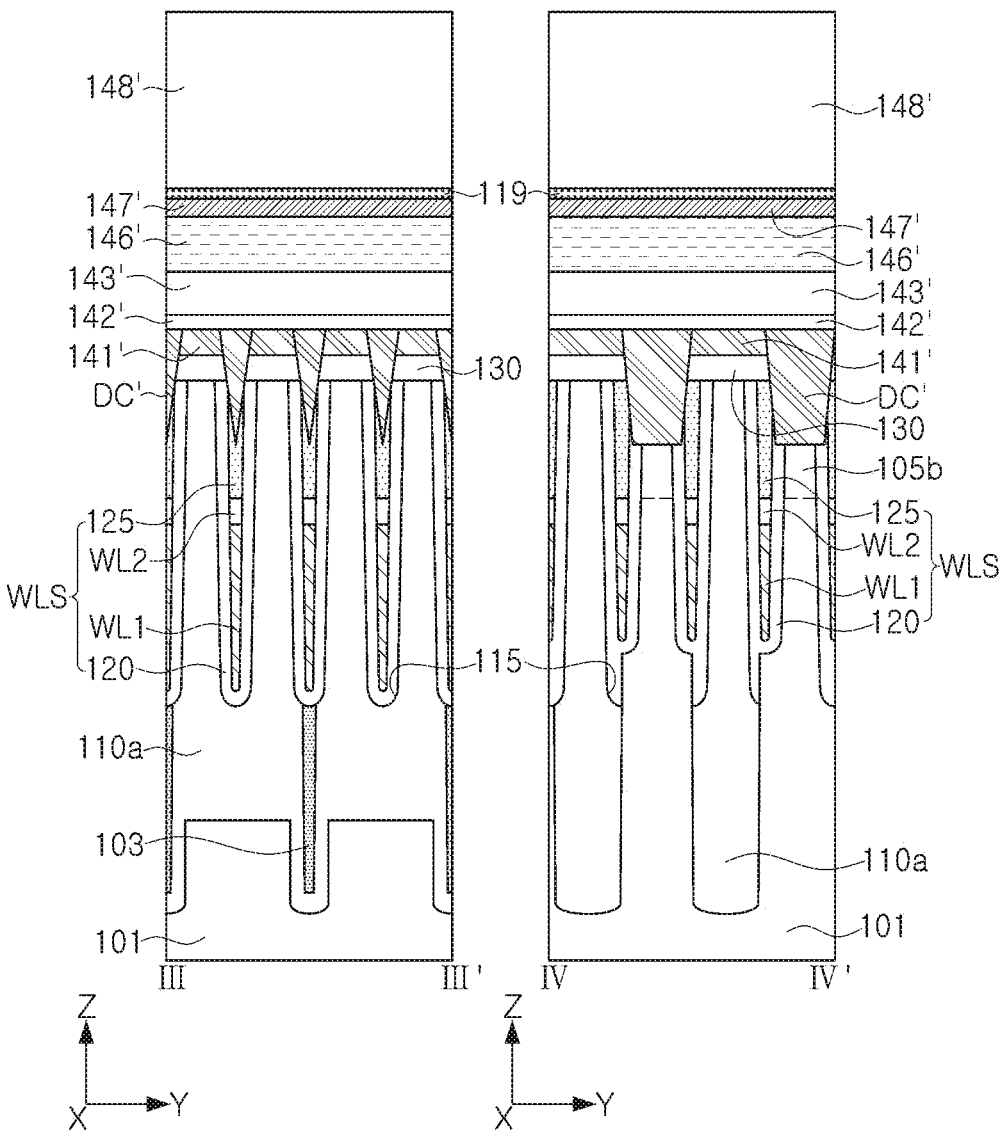
Figure 7C:
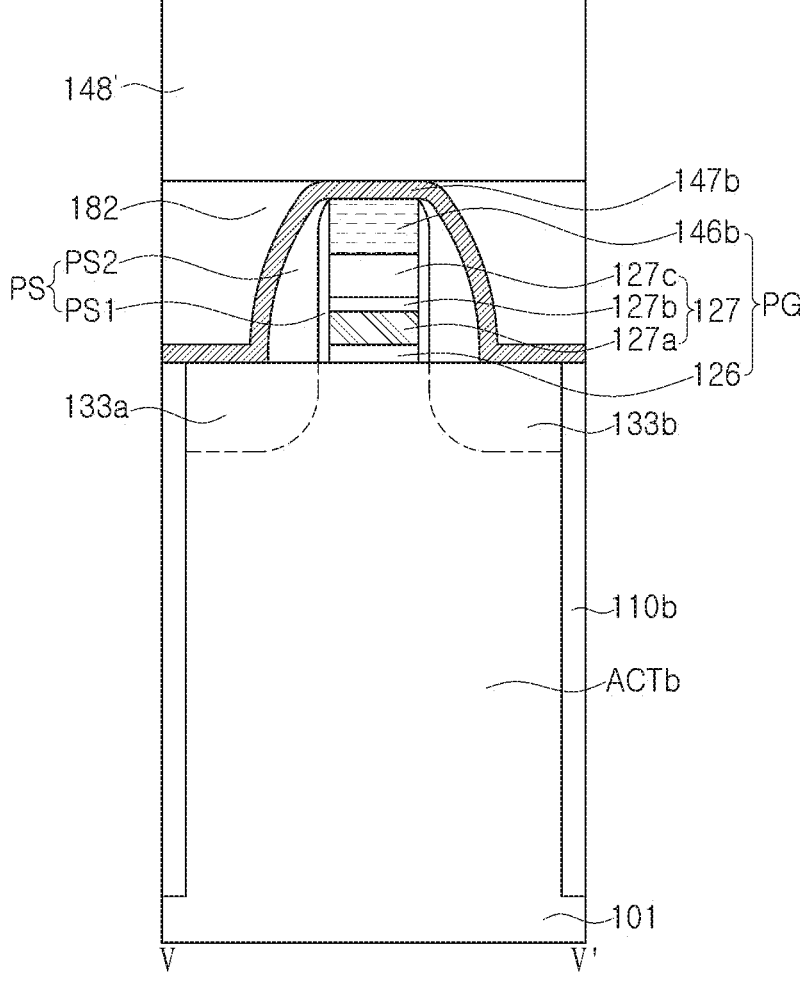

Referring to FIGS. 7A to 7C, a third capping layer 148' may be formed.

The third capping layer 148' may be formed to fully or at least partially cover the sacrificial buffer layer 119 on the first region R1 and the peripheral insulating liner 147*b* and the peripheral insulating layer 182 on the second region R2. The third capping layer 148' may include an insulating material, for example, a nitride-based material such as silicon nitride, silicon oxynitride, and silicon carbonitride. The third capping layer 148' may be formed to have a thicker thickness than the sacrificial buffer layer 119.

Figure 8A:
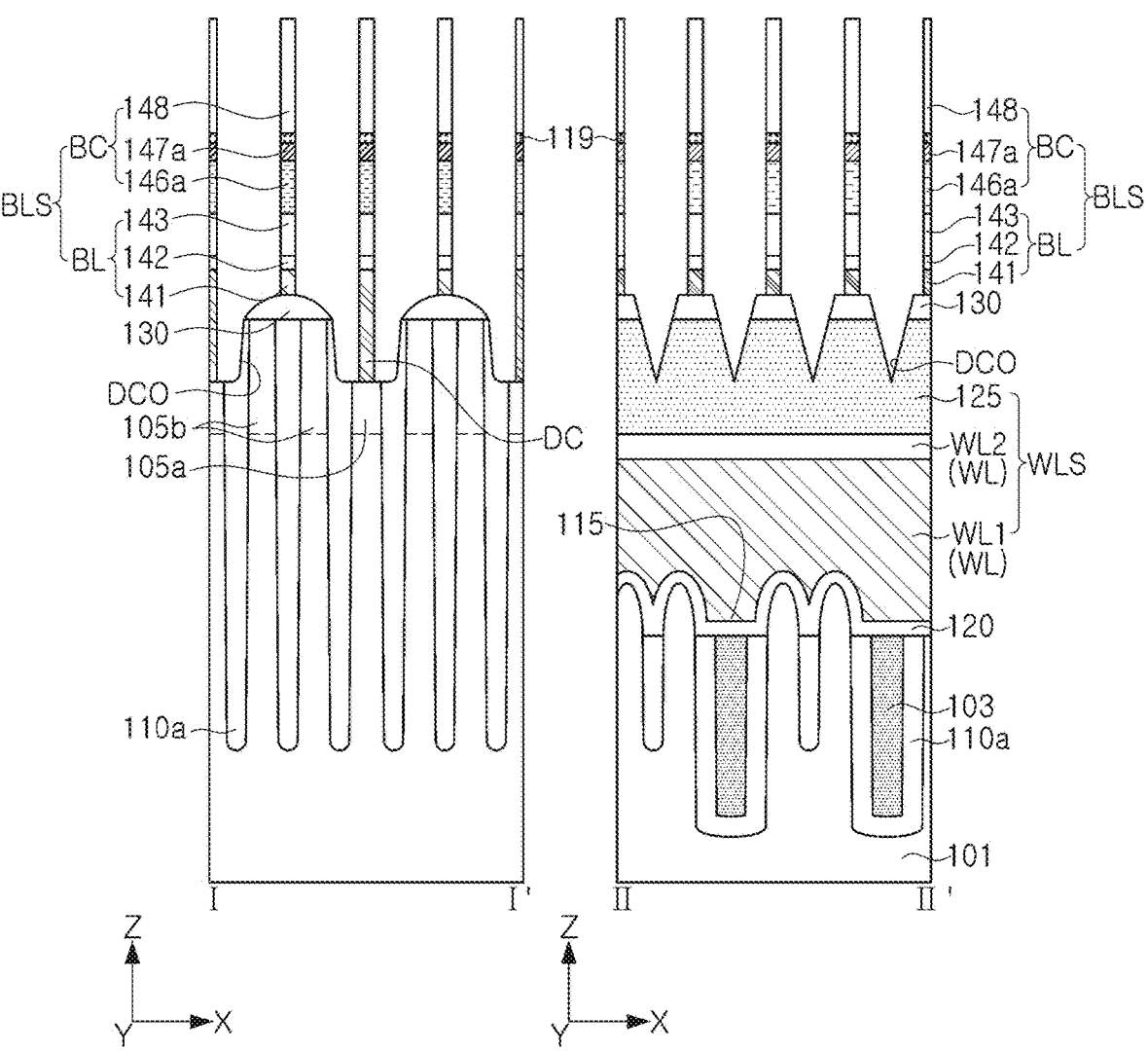
Figure 8B:
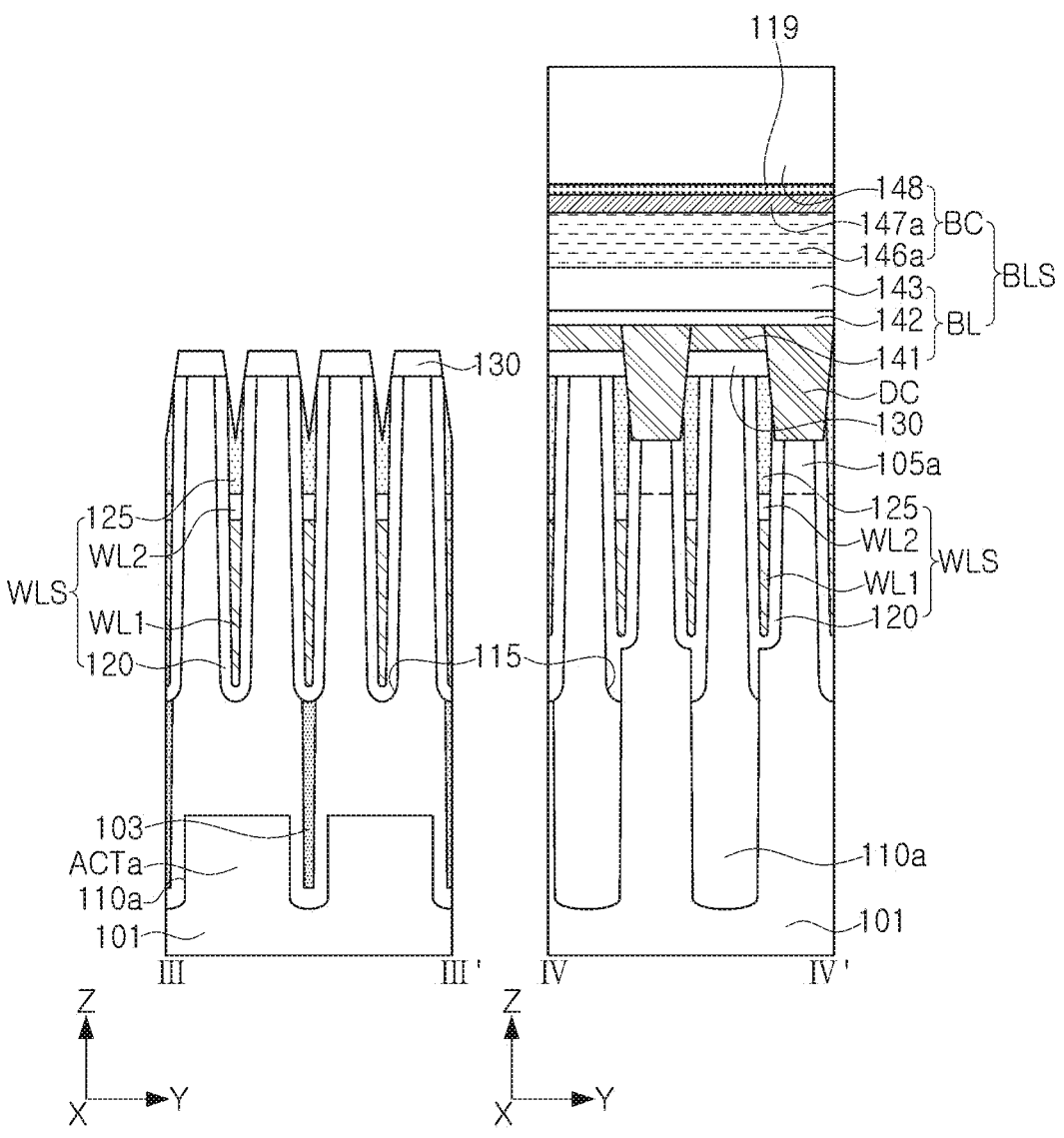
Figure 8C:
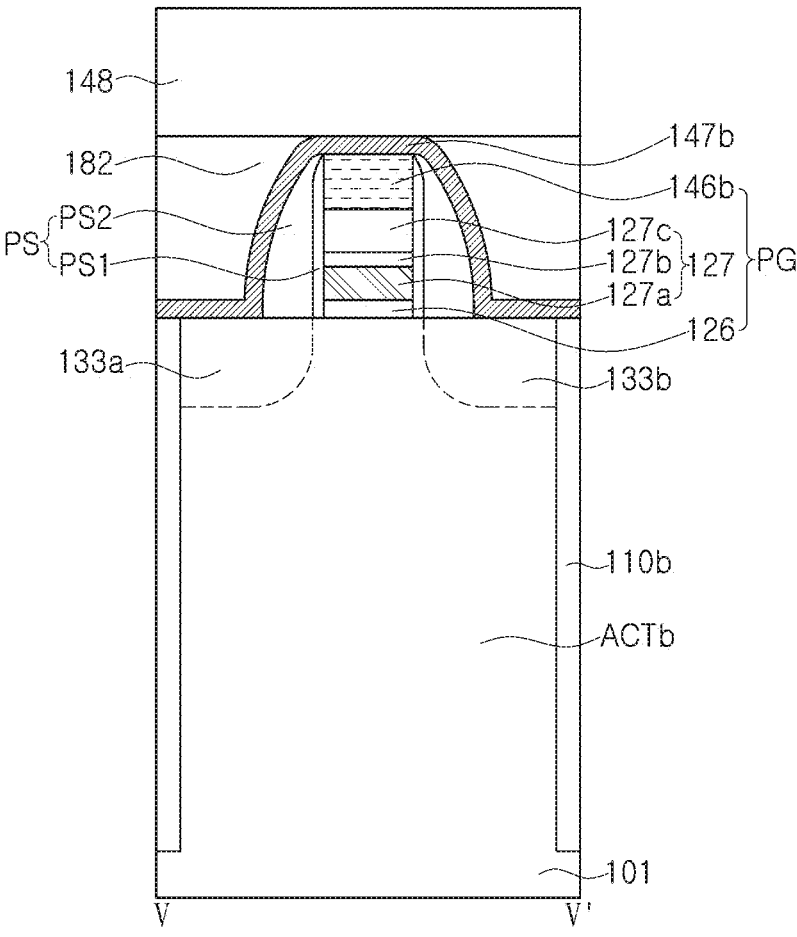

Referring to FIGS. 8A to 8C, bit line structures BLS may be formed.

The buffer layer 130, the first to third conductive layers 141', 142', and 143', the first to third capping layers 146', 147', and 148', and the sacrificial buffer layer 119 may be patterned to form the bit line structures BLS extending in the Y-direction, which may be the second horizontal direction. The bit line structures BLS may include first to third conductive patterns 141, 142, and 143, and first to third capping patterns 146*a*, 147*a*, and 148, sequentially stacked. The sacrificial buffer layer 119 may have a width, substan- tially equal to a width (defined in the X-direction) of each of the second capping pattern 147*a* and the third capping pattern 148, between the second capping pattern 147*a* and the third capping pattern 148.

Figure 9A:
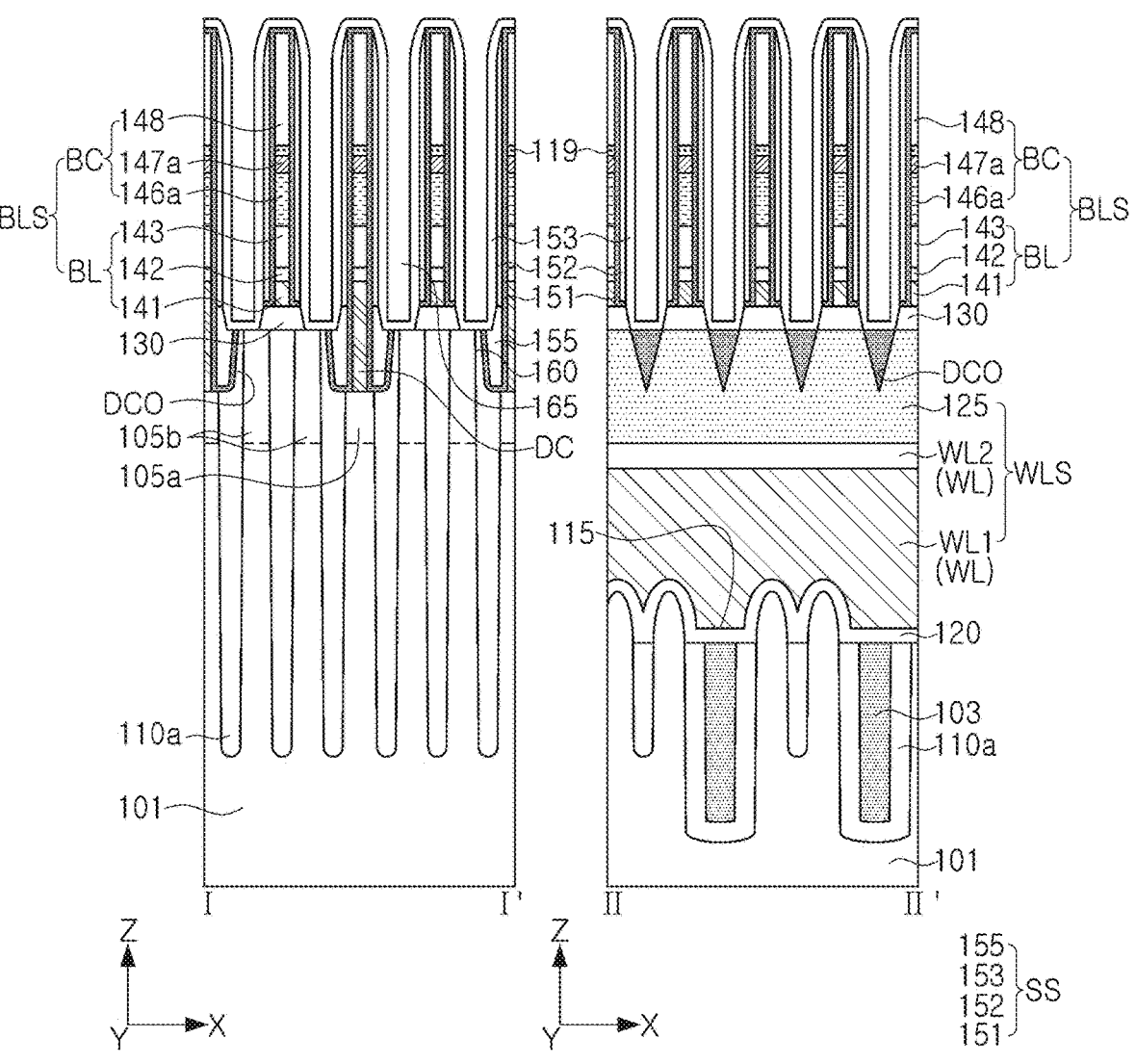
Figure 9B:
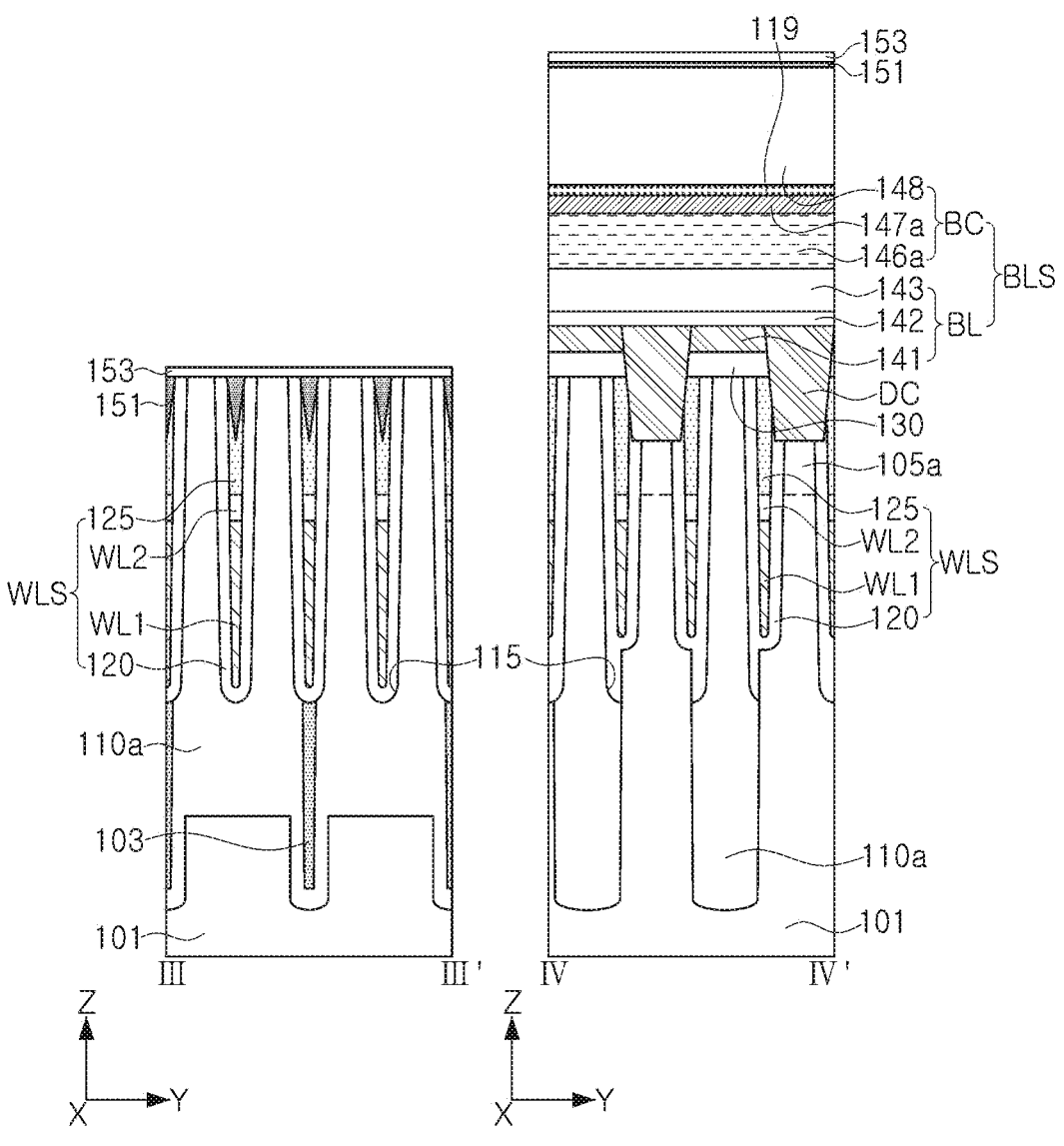
Figure 9C:
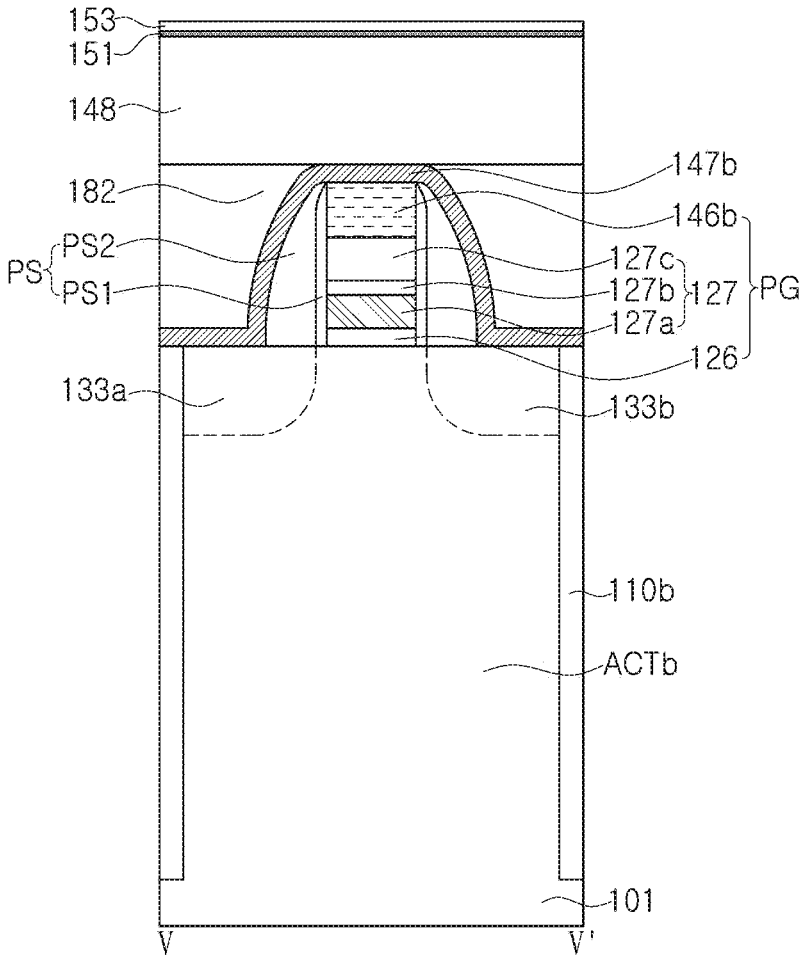

Referring to FIGS. 9A to 9C, spacer structures SS may be formed on first and second (e.g. both) side walls of the bit line structures BLS.

In the spacer structures SS, a first upper spacer 151 may be formed on both side walls of the bit lines BL and side and bottom surfaces of the bit line contact opening DCO, a lower spacer 155 may be formed by filling a remaining portion thereof, and a second upper spacer 152 may be formed by depositing an insulating material to cover the first upper spacer 151 and performing anisotropic etching. The first upper spacer 151 may include, for example, silicon nitride and may or may not include silicon oxide. The lower spacer 155 may include at least one of silicon nitride, or silicon carbonitride, and may be formed as a plurality of layers. The second upper spacer 152 may be formed of an insulating material having etch selectivity with respect to the first upper spacer 151, and may be formed of, for example, silicon oxide and may or may not include silicon nitride. Next, a third upper spacer 153 conformally covering the second upper spacer 152 and the lower spacer 155 may be formed, e.g. with a process such as a plasma enhanced chemical vapor deposition (PECVD) process. The third upper spacer 153 may include, for example, silicon nitride.

Figure 10B:
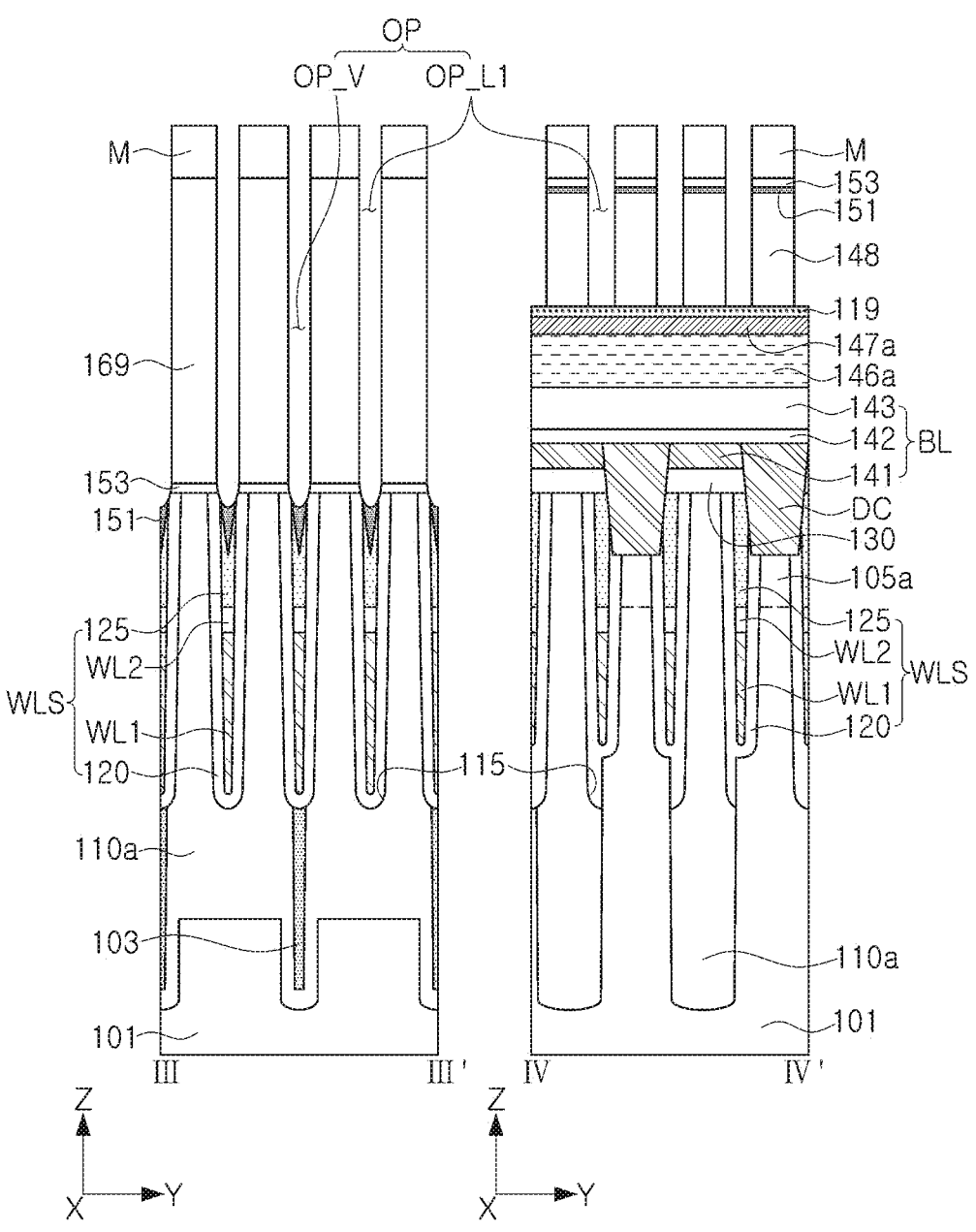
Figure 10C:
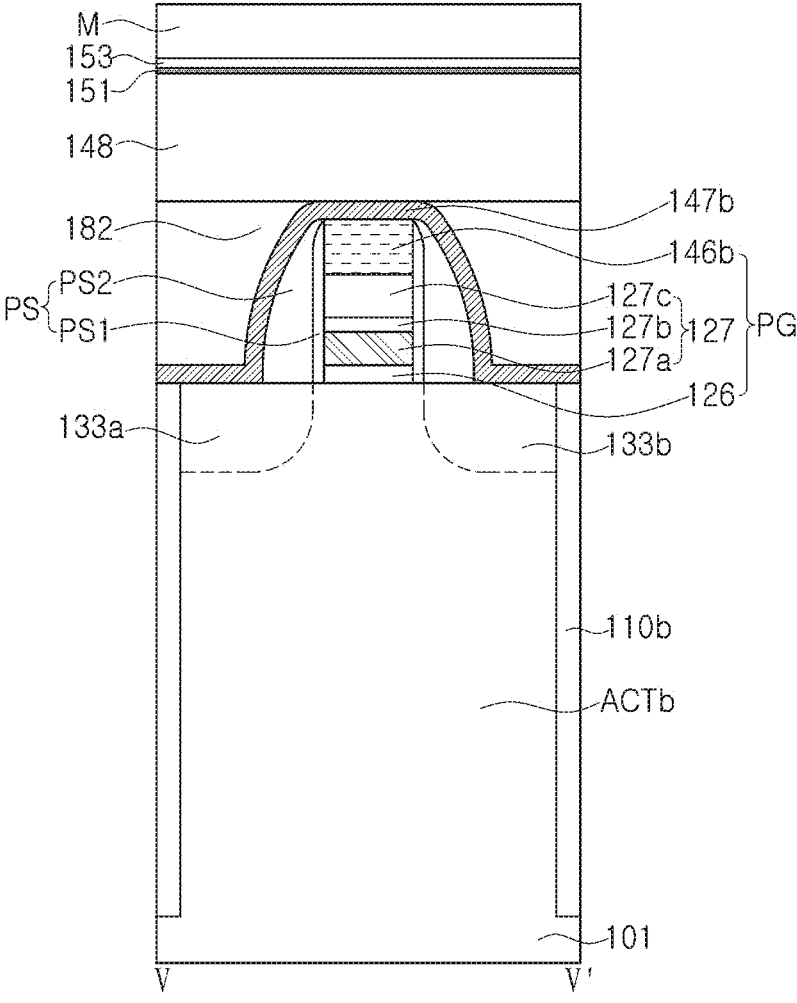

Referring to FIGS. 10A to 10C, a sacrificial insulating layer 169 may be formed, and an opening OP may be formed by performing an etching process using a mask layer M.

The sacrificial insulating layer 169 filling between the spacer structures SS may be formed on the first region R1. The sacrificial insulating layer 169 may include, for example, silicon oxide. Next, an anisotropic etching process such as a dry etching process may be performed using the mask layer M to form the opening OP. The opening OP may include a first line opening portion OP_L1 extending in the X-direction, which may be a first horizontal direction, and a pillar opening portion OP_V extending toward the substrate 101 by a predetermined depth more than the first line opening portions OP_L1.

The first line opening portions OP_L1 may overlap the word line structures WLS in the Z-direction. Therefore, the first line opening portions OP_L1 may be spaced apart from each other in the Y-direction, and may extend in parallel in the X-direction. The first line opening portions OP_L1 may be regions formed by removing portions of the spacer structures SS and a portion of the capping pattern BC, exposed by the mask layer M. The first line opening portions OP_L1 may expose the sacrificial buffer layer 119. The sacrificial buffer layer 119 may serve as an etch stop layer in the etching process. The sacrificial buffer layer 119 may prevent the bit line BL as well as the first and second capping patterns 146*a* and 147*a* from being exposed in an upward direction. Therefore, a semiconductor device having improved electrical characteristics and productivity may be provided by improving a process defect such as a portion of the bit line BL being etched or affected by a subsequent process, or the like. Also, compared to a case in which the sacrificial buffer layer 119 is omitted, a thickness of the first capping pattern 146*a* or a thickness of the third capping pattern 148 may be relatively reduced.

The pillar opening portions OP_V may be opening por- tions penetrating the sacrificial insulating layer 169 between the spacer structures SS. A plurality of pillar opening por- tions OP_V extending from one of the first line opening portions OP_L1 through the sacrificial insulating layer 169 may be spaced apart from each other in the X-direction. In addition, each of the pillar opening portions OP_V extend- ing from a plurality of first line opening portions OP_L1 through the sacrificial insulating layer 169 may be spaced apart from each other in the Y-direction.

Figure 11A:
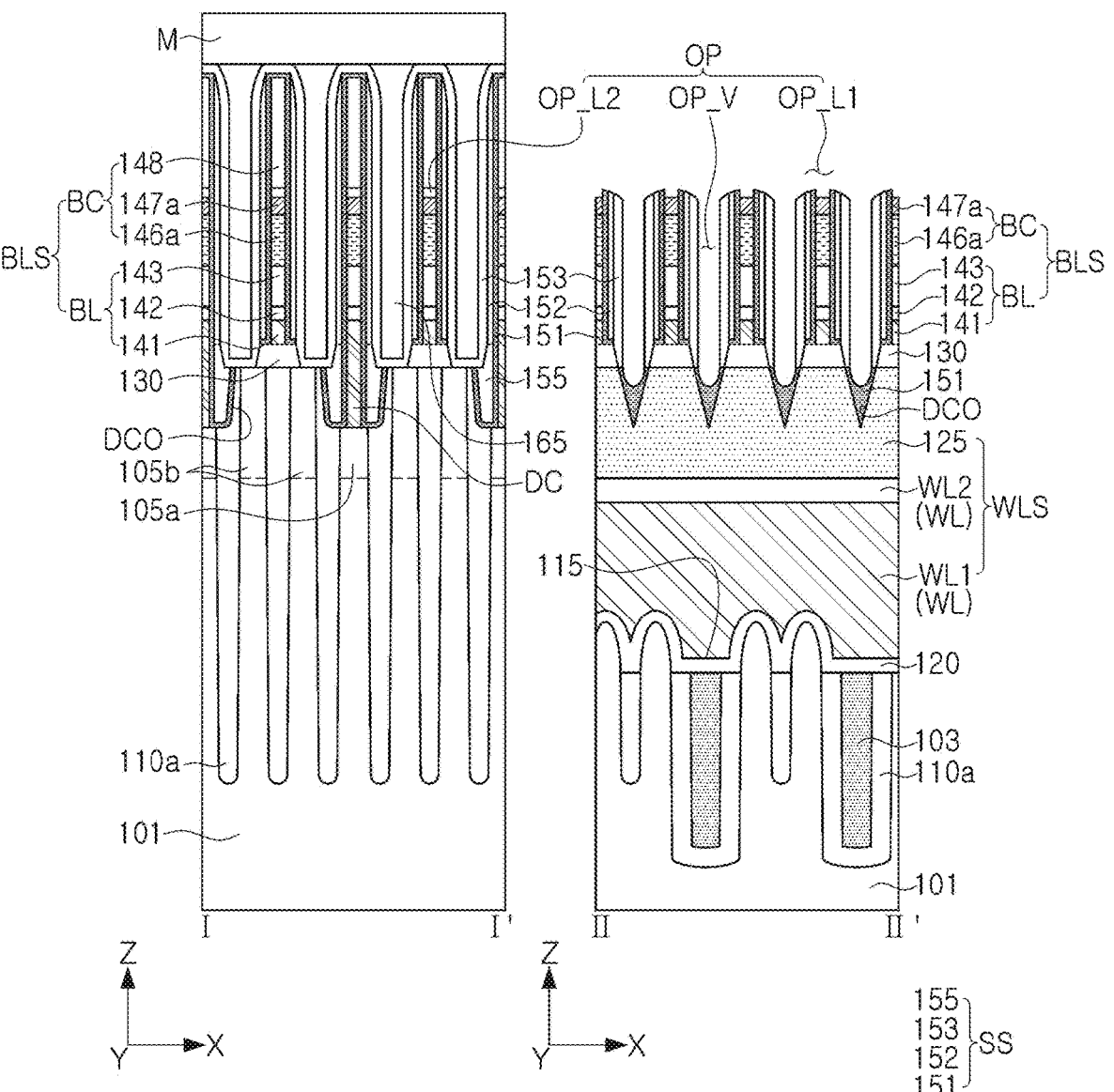
Figure 11B:
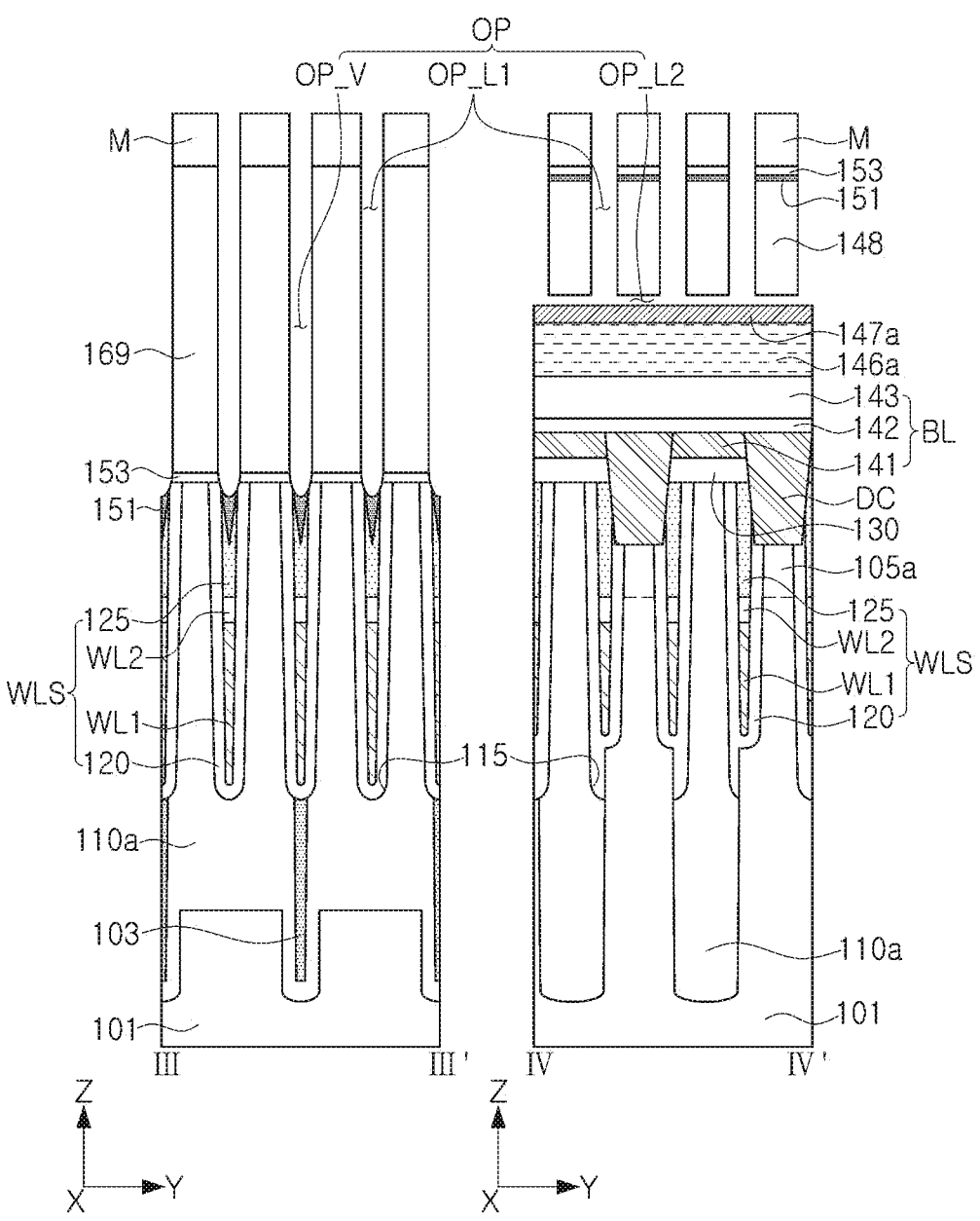

Referring to FIGS. 11A and 11B, the sacrificial buffer layer 119 may be removed to form second line opening portions OP_L2.

A selective etching process for selectively removing the sacrificial buffer layer 119 exposed through the opening OP with respect to the first to third capping patterns 146*a*, 147*a*, and 148 may be performed to form the second line opening portions OP_L2. The selective etching process may be performed by a wet etching process under specific etching conditions. For example, the second line opening portions OP_L2 may be regions corresponding to the sacrificial buffer layer 119, may extend in the Y-direction, and may be disposed between the second and third capping patterns 147*a* and 148.

Figure 12A:
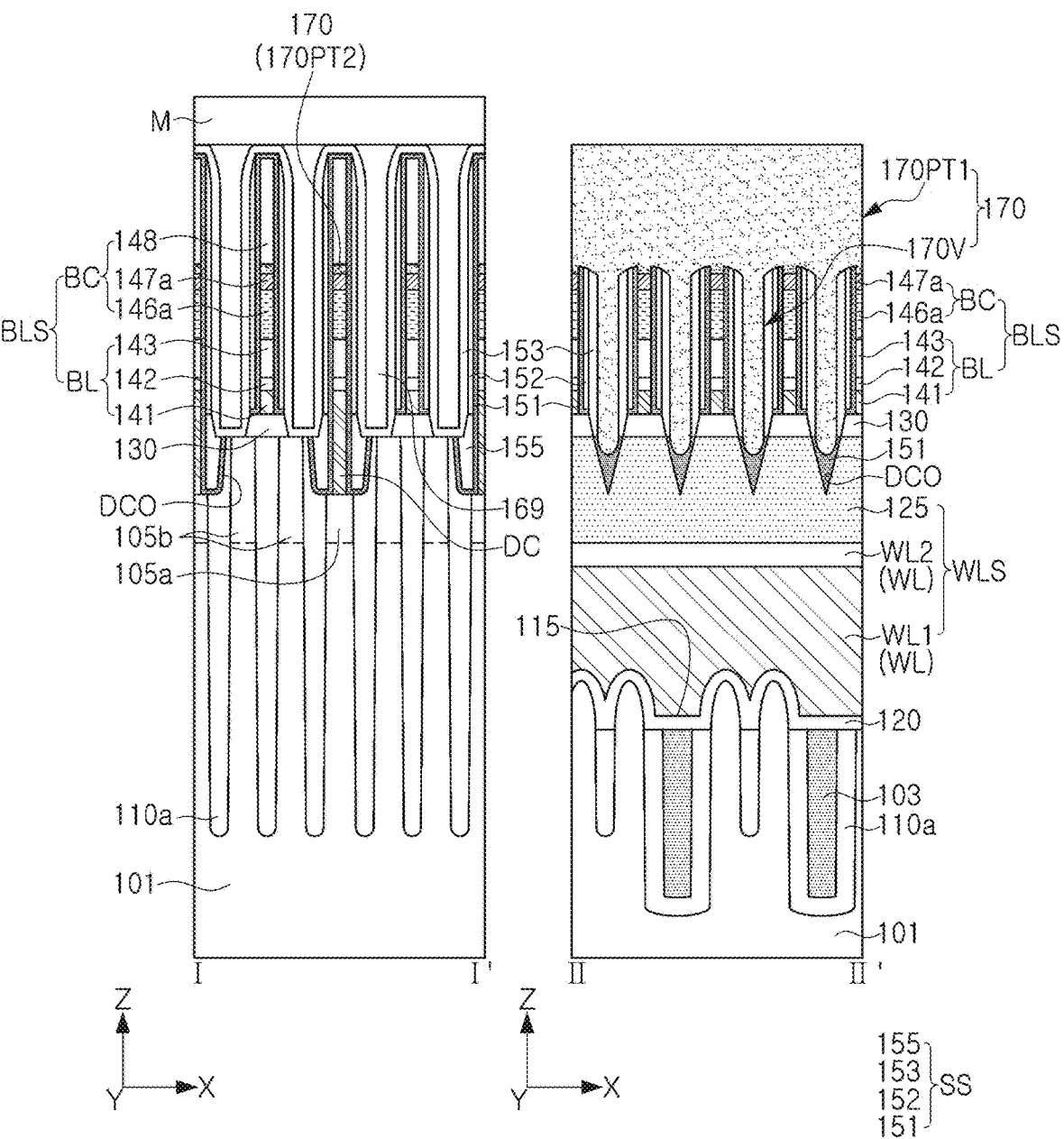
Figure 12B:
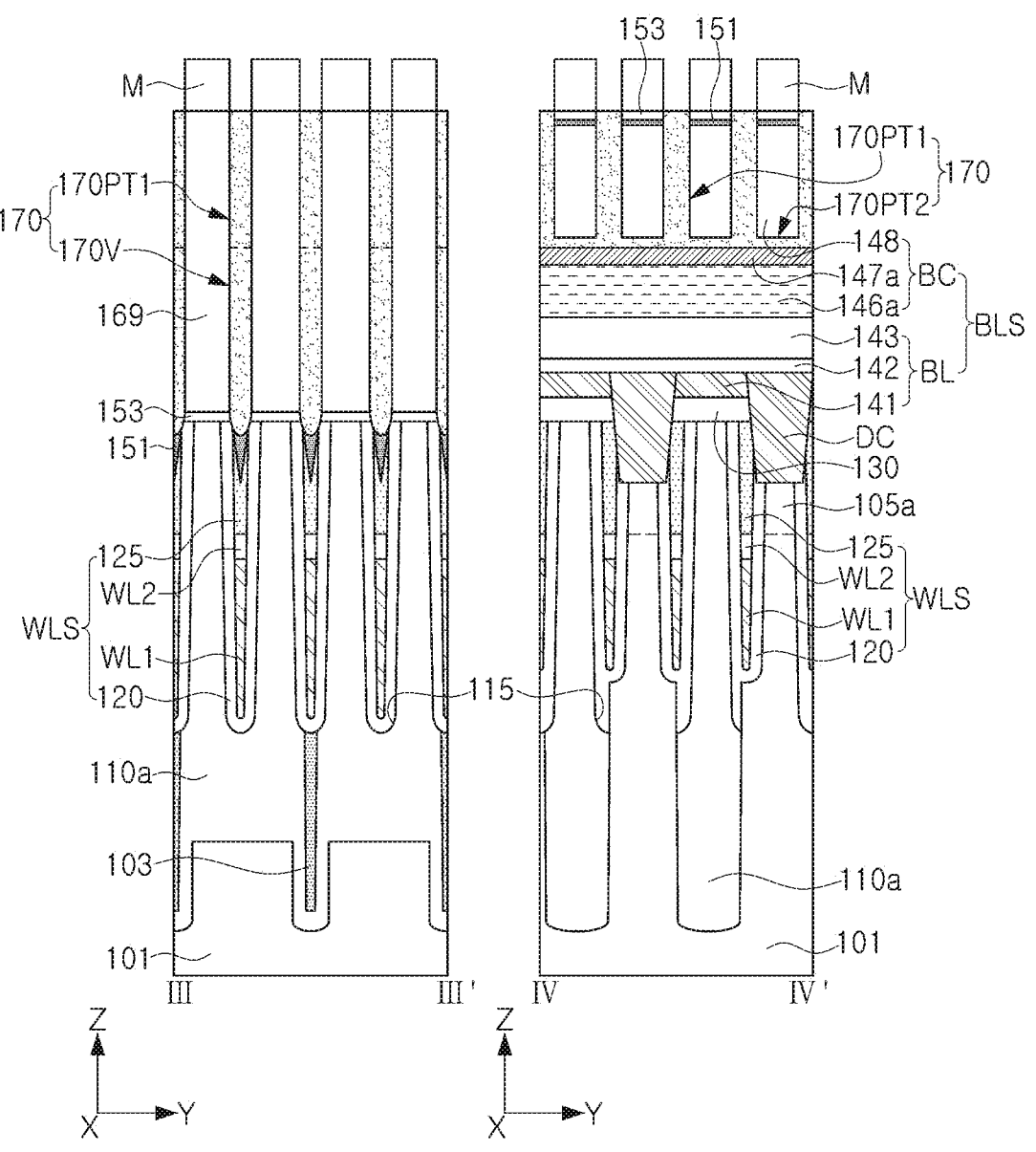

Referring to FIGS. 12A and 12B, a fence structure 170 may be formed.

The fence structure 170 may be formed by depositing an insulating material in the opening OP and performing a planarization process such as with a chemical mechanical planarization (CMP) process and/or an etch-back process. The insulating material may be, for example, at least one of silicon nitride, silicon oxynitride, or silicon carbonitride. The fence structure 170 may include first line pattern portions 170PT1 filling the first line opening portions OP_L1, second line pattern portions 170PT2 filling the second line opening portions OP_L2, and pillar portions 170V filling the pillar opening portions OP_V. Node separation for forming a storage node contact 160 (see FIGS. 2A to 2C) may be completed by forming the fence structure 170.

Next, referring back to FIGS. 2A to 2C, an etching process and a deposition process may be performed using the fence structure 170 as an etching mask, to form a storage node contact 160 passing through the sacrificial insulating layer 169 and the buffer layer 130 and contacting the first impurity region 105*a*, a metal-semiconductor layer 165 and a landing pad LP may be formed on the storage node contact 160, a capping insulating layer 180 spacing adjacent landing pads LP apart may be formed, and an information storage structure 190 electrically connected to the landing pad on the capping insulating layer 180 and the landing pad LP may be formed. Therefore, the semiconductor device 100 of FIGS. 1A to 3 may be formed.

A semiconductor device having improved electrical characteristics and/or productivity may be provided by using a sacrificial buffer layer to prevent or reduce the likelihood of and/or impact from a bit line collapse phenomenon in an etching process for forming a fence structure.

Various advantages and effects of various example embodiments are not limited to the above, and will be more easily understood in the process of describing specific example embodiments of various example embodiments.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%).

While various example embodiments have been illustrated and described above, it will be apparent to those of ordinary skill in the art that modifications and variations could be made without departing from the scope of various example embodiments as defined by the appended claims. Additionally, example embodiments are not necessarily mutually exclusive. For example, some example embodiments may include one or more features described with reference to one or more figures, and may also include one or more other features described with reference to one or more other figures.

What is claimed is:

1. A semiconductor device comprising:
a substrate having an active region;
word line structures in the substrate and extending in parallel to each other in a first horizontal direction;
bit line structures on the substrate and on the word line structures and extending in parallel to each other in a second horizontal direction that intersects the first horizontal direction;
storage node contacts on a side wall of each of the bit line structures and electrically connected to the active region; and
a fence structure having first line pattern portions on the word line structures and extending in the first horizontal direction, second line pattern portions extending in the second horizontal direction and crossing the first line pattern portions, and pillar portions extending in a vertical direction from the first line pattern portions between the bit line structures, the vertical direction perpendicular to an upper surface of the substrate.

2. The semiconductor device of claim 1, wherein the first line pattern portions, the second line pattern portions, and the pillar portions are integrally connected, and the fence structure includes at least one of silicon nitride, silicon oxynitride, or silicon carbonitride.

3. The semiconductor device of claim 1, wherein a first thickness of each of the first line pattern portions is thicker than a second thickness of each of the second line pattern portions.

4. The semiconductor device of claim 3, wherein the second thickness ranges from 1 nm to 10 nm.

5. The semiconductor device of claim 1, wherein the second line pattern portions connect lower regions of the first line pattern portions to each other.

6. The semiconductor device of claim 1, wherein upper surfaces of the first line pattern portions are above upper surfaces of the second line pattern portions.

7. The semiconductor device of claim 1, wherein the second line pattern portions are on a level that is below an upper surface of each of the bit line structures and above a lower surface of each of the bit line structures.

8. The semiconductor device of claim 7, wherein each of the bit line structures comprises a bit line and a bit line capping pattern on the bit line, and the second line pattern portions pass through the bit line capping pattern in the second horizontal direction.

9. The semiconductor device of claim 8, wherein a width of each of the second line pattern portions in the first horizontal direction is equal to a width of the bit line capping pattern in the first horizontal direction.

10. The semiconductor device of claim 1, wherein the second line pattern portions are above the storage node contacts.

11. The semiconductor device of claim 1, further comprising:

spacer structures between the bit line structures and the storage node contacts, wherein the bit line structures include a first bit line structure and a second bit line structure adjacent to each other, the spacer structures include first spacer structures on first and second side walls of the first bit line structure and second spacer structures on first and second side walls of the second bit line structure, at least a portion of the fence structure as the first line pattern portions extends in the vertical direction between the first spacer structures and the second spacer structures, and at least a portion of the fence structure as the second line pattern portions extends between the first spacer structures or between the second spacer structures in the second horizontal direction.

12. The semiconductor device of claim 1, further comprising:

a bit line contact electrically connecting each of the bit line structures and the active region;

a landing pad on each of the storage node contacts and electrically connected to each of the storage node contacts; and an information storage structure on the landing pad and electrically connected to the landing pad.

13. A semiconductor device comprising:

a substrate having a first region and a second region, the substrate including an active region;

a peripheral gate structure including a peripheral dielectric layer, a peripheral gate electrode, and a peripheral capping layer that are sequentially stacked on the second region;

a peripheral insulating liner conformally covering the peripheral gate structure;

a word line structure extending in a first horizontal direction in the first region;

a bit line structure on the substrate and on the word line structure, extending in a second horizontal direction that intersects the first horizontal direction, and including a bit line and a bit line capping pattern on the bit line;

a spacer structure disposed on first and second sides of the bit line structure;

a storage node contact on at least one side of the bit line structure and electrically connected to the active region; and a fence structure on the word line structure and including a first line pattern portion extending in the first horizontal direction and pillar portions extending from the first line pattern portion toward the substrate in a vertical direction, wherein the bit line capping pattern includes a first capping pattern having a material that is identical to a material of the peripheral capping layer, and the bit line capping pattern includes a second capping pattern having a material that is identical to a material of the peripheral insulating liner, wherein the first line pattern portion is on an upper surface of the second capping pattern, and the fence structure further comprises a second line pattern portion integrally connected to the first line pattern portion on the word line structure extending in the second horizontal direction, and crossing the first line pattern portion.

14. The semiconductor device of claim 13, wherein the second line pattern portion is located on a higher level than the second capping pattern.

15. The semiconductor device of claim 13, wherein the second line pattern portions entirely overlap the bit line in the vertical direction.

16. The semiconductor device of claim 13, wherein the spacer structure comprises a first portion covered by the fence structure and a remaining second portion having an upper surface that is above the first portion, and an upper end of the first portion is on a different level from an upper surface of the second capping pattern.

17. The semiconductor device of claim 16, wherein the upper end of the first portion protrudes upwardly from the upper surface of the second capping pattern.

18. A semiconductor device comprising:

a substrate having an active region;

word line structures in the substrate and extending in parallel to each other in a first horizontal direction;

a bit line structure on the substrate and on the word line structures, extending in a second horizontal direction that intersects the first horizontal direction, and including a bit line and a bit line capping pattern on the bit line;

storage node contacts on a side wall of the bit line structure and electrically connected to the active region; and an insulating structure including a line pattern portion extending in the second horizontal direction in the bit line capping pattern and protrusions integrally connected to the line pattern portion and protruding in a region vertically overlapping each of the word line structures, wherein each of the protrusions has a portion overlapping each of the word line structures in a vertical direction, perpendicular to an upper surface of the substrate.

19. The semiconductor device of claim 18, wherein the bit line capping pattern comprises a first capping pattern and a second capping pattern on the first capping pattern, the line pattern portion is between the first capping pattern and the second capping pattern, and the first capping pattern and the second capping pattern are spaced apart from each other by the line pattern portion.

20. The semiconductor device of claim 19, wherein a side surface of the line pattern portion is coplanar with a side surface of the first capping pattern and a side surface of the second capping pattern, respectively.

\* \* \* \* \*